US006097059A

United States Patent [19]

Yamada

[11] Patent Number: 6,097,059

[45] Date of Patent: Aug. 1, 2000

[54] TRANSISTOR, TRANSISTOR ARRAY, METHOD FOR MANUFACTURING TRANSISTOR ARRAY, AND NONVOLATILE SEMICONDUCTOR MEMORY

[75] Inventor: Kouichi Yamada, Hasima-gun, Japan

[73] Assignee: Sanyo Electric Co., Ltd., Moriguchi, Japan

[21] Appl. No.: 08/997,515

[22] Filed: Dec. 23, 1997

[30] Foreign Application Priority Data

Dec. 27, 1996 [JP] Japan .................................... 8-350901
May 15, 1997 [JP] Japan .................................... 9-125750

[51] Int. Cl.[7] .................................................. H01L 29/788

[52] U.S. Cl. .......................... 257/321; 257/315; 257/316; 257/319

[58] Field of Search .................................... 257/315, 316, 257/319, 320, 321

[56] References Cited

U.S. PATENT DOCUMENTS 4,933,904 6/1990 Stewart et al. ...................... 365/185.02
5,021,999 6/1991 Kohda et al. ....................... 365/185.03
5,511,036 4/1996 Farb et al. ........................... 365/185.1
5,835,409 11/1998 Lambertson ....................... 365/185.15
5,877,523 3/1999 Liang et al. ............................ 257/315

FOREIGN PATENT DOCUMENTS 38 42 511 6/1989 Germany ....................... H01L 29/78
60-065576 4/1985 Japan .
2300969 11/1996 United Kingdom .
WO 92/18980 10/1992 WIPO .

OTHER PUBLICATIONS

Montalvo, A.J., et al, "Improved Floating–Gate Devices Using Standard CMOS Technology," IEEE Electron Device Letters, vol. 24, No. 8, Aug. 1, 1993.

Silicon Processing for the VLSI Era, vol. 1: Process Technology, S. Wolf et al., p. 191, 1986.

Microelectronic Processing, An Introduction to the Manufacture of Integrated Circuits, W. Ruska, p. 92, 1987.

Principles of Electronic Circuits, Burns et al., p. 231, 1987.

*Primary Examiner*—David Hardy
*Assistant Examiner*—George C. Eckert, II
*Attorney, Agent, or Firm*—Armstrong, Westerman, Hattori, McLeland & Naughton

[57] ABSTRACT

A memory cell including source-drain regions, a channel region, floating gate electrodes, and a control gate electrode. The floating gate electrodes are placed next to each other over the channel region on a gate insulating layer. The control gate electrode is located over the floating gate electrodes on an insulating layer and an insulating layer, both layers being formed by a LOCOS method. Protuberances are formed on the upper corners of the floating gate electrodes by the insulating layer. A central portion of the control gate electrode is laid over the channel region on insulating layers, to form a selecting gate. A selecting transistor comprises this selecting gate between both the source-drain regions.

18 Claims, 26 Drawing Sheets

TRANSISTOR, TRANSISTOR ARRAY, METHOD FOR MANUFACTURING TRANSISTOR ARRAY, AND NONVOLATILE SEMICONDUCTOR MEMORY

BACKGROUND OF THE INVENTION

1. Field of the Invention

The present invention relates to transistors, transistor arrays, methods of manufacturing transistor arrays, and to nonvolatile semiconductor memories.

2. Description of the Related Art

Nonvolatile semiconductor memories such as FeRAM (Ferro-electric Random Access memory), EPROM (Erasable and Programmable Read Only Memory), and EEPROM (Electrically Erasable and Programmable Read Only Memory) are currently attracting attention. EPROMs and EEPROMs store data by storing an electrical charge at a floating gate and then using a control gate to detect changes in a threshold voltage thereof due to the presence or absence of an electrical charge. One current EEPROM is an EEPROM which erases data in a unit of a complete memory chip, and another is a flash EEPROM which divides memory cell arrays thereof into arbitrary blocks and data erasing is carried out for each block.

Flash EEPROMs have advantages such as (1) non-volatility of stored data, (2) low power consumption, (3) capability of electrical rewriting (on-board rewriting), and (4) low cost. Therefore, their range of application has been spreading to include storage memories for programs or data used in cellular phones and mobile information terminals.

Memory cells which constitute flash EEPROMs have several types including split gate and stacked gate types.

In a flash EEPROM which uses stacked gate type memory cells, memory an cells do not have a self-selection function. Therefore, when an electric charge is over-discharged from a floating gate electrode while erasing data, a channel region will become ON, even when a predetermined voltage for an OFF state (e.g., 0V) is applied to a control gate electrode. As a consequence, memory cells are continually kept in an ON state, and a problem that reading stored data becomes impossible, that is, a so-called over-erase problem, occurs. To prevent over-erase from occurring, processing is necessary in an erasing operation such as controlling erasing operation at a peripheral circuit of a memory device or at an external circuit thereof.

To prevent over-erase in stacked gate type memory cells, split-type memory cells have been developed.

A flash EEPROM using split-type gate memory cells has been disclosed in WO92/18980 (G11C 13/00).

FIG. 19 is a cross-section of a conventional split gate type memory cell 201.

The split gate type memory cell 201 (split gate type transistor) comprises a source region 203, drain region 204, a channel region 205, a floating gate electrode 206, and a control gate electrode 207.

The N type source region 203 and drain region 204 are formed on a P type monocrystalline silicone substrate. Over the channel region 205 which lies between the source region 203 and the drain region 204, the floating gate electrode is formed with a gate insulating layer 208 covering the channel region 205 and the floating gate electrode 206. The control gate electrode 207 is formed over the floating gate electrode 206 which is covered by an insulating layer 209 made by LOCOS (Local Oxidation of Silicon) method, with an insulating layer 210 lying between the floating gate electrode 206 and the control gate electrode 207. As it is covered with the insulating layer 209, the floating gate electrode has two protuberances 206*a* in an upper portion thereof.

A portion of the control gate electrode 207 lies over the channel region 205 with the insulating layers 208 and 210 lying between the portion of the control gate 207 and the channel region 205, and forms a selecting gate 211. A selecting transistor 212 is formed with the selecting gate 211, the source region 203, and the drain region 204. In other words, the split gate type memory cell 201 comprises the selecting transistor 212 and transistors which comprise the floating gate electrode 206, the control gate electrode 207, the source region 203, and the drain region 204, the aforesaid transistors being laid out in series.

FIG. 20*a* is a partial cross section of a memory cell array 302 included in a flash EEPROM 301 using the split gate type memory cells 201.

The memory cell array 302 comprises a plurality of memory cells 201 formed on a silicon substrate 202.

To keep the region occupied on the silicon substrate 202 small, two memory cells 201 (hereafter called 201*a* and 201*b* for distinction) share the source region 203, and the floating gate electrodes 206 and the control gate electrodes 207 are lad out symmetrically around the common source region 203.

FIG. 20*b* is a partial top view of the memory cell array 302. FIG. 20*a* is the cross section of the memory cell array 302 cut by the line X—X shown in FIG. 20*b*.

A field insulating layer 213 is formed on the silicon substrate 202, and the field insulating layer separates elements of each memory cell 201. Each source region 203 laid out vertically in FIG. 20*b* is shared. Also, each control gate electrode 207 of each memory cell 201, the control gate electrode being laid out vertically in FIG. 20*b*, is shared. Each control gate electrode forms a word line. Each drain region 204 laid out horizontally in FIG. 20*b* is connected to a bit line (not shown) via a bit line contact 214.

FIG. 21 shows an entire configuration of the flash EPROM 301 using split gate type memory cells 201.

The memory cell array 302 is configured with a plurality of memory cells 201 laid out to form a matrix. The control gate electrodes 207 which are laid out in rows form common word lines WL1–WLn. The drain regions 204 of memory cells 201 are laid out in columns and connected to common bit lines BL1–BLn.

Each memory cell 201*b* connected to a word line with an odd number (WL1, WL3, . . . WLm . . . WLn−1) shares the source region 203 with each memory cell 201*a* connected to a word line with an even number (WL2, WL4, . . . WLm+1 . . . WLn). The shared source region 203 forms each source line RSL1–RSLm–RSLn. For example, the memory cell 201*b* which is connected to a word line WLm and the memory cell 201*a* which is connected to a word line WLm+1 share the source region 203, while the shared source region 203 forms a source line RSLm. Each source line RSL1–RSLn is connected to a common source line SL.

Each word line WL1–WLn is connected to a row decoder 303, while each bit line BL1–BLn is connected to a column decoder 304.

Row and column addresses specified by an external source are input to an address pin 305. The row address and column address are transferred from the address pin 305 to an address latch 307 via an address buffer 306. Among the addresses latched by the address latch 307, the row address is transferred to the row decoder 303, while the column address is transferred to the column decoder 304.

The row decoder 303 selects a word line which corresponds to the row address latched by the address latch 307 (for example, WLm), and controls a voltage of each word line WL1–WLn corresponding to a later-described operation mode. In other words, by controlling the voltage of each word line WL1–WLn, a voltage of each control gate electrode 207 in each memory cell 201 is controlled.

The column decoder 304 selects a word line which corresponds to the column address latched by the address latch 307 (for example, BLm), and controls a voltage of each bit line BL1–BLn corresponding to a later-described operation mode. In other words, the voltage of each drain region 204 in each memory cell 201 is controlled by controlling the voltage of each bit line BL1–BLn.

The common source line SL is connected to a bias circuit 312. The source line bias circuit 312 controls, via the common source line SL, a voltage of each source line SL1–SLn corresponding to each later-described operation mode. In other words, by controlling the voltage of each source line SL1–SLn, the voltage of each source region 203 in each memory cell 201 is controlled.

Data specified by an external source is input to data pin 308. The data is transferred from the data pin 308 to the column decoder 304 via an input buffer 309. The column decoder 304 controls the voltage of each bit line BL1–BLn corresponding to the data, as will be described later.

Data read from any memory cell 201 is transferred from the bit line BL1–BLn to a sense amplifier 310 via the column decoder 304. The sense amplifier 310 is a current sense amplifier. The column decoder 304 connects one bit line BL1–BLn which the column decoder selects with the sense amplifier 310. The distinguished data by the sense amplifier 310 is output from an output buffer 311 to outside via the data pin 308.

The above-described operations of each circuit (303–312) are controlled by a control core circuit 313.

Each operation mode of the flash EEPROM 301 (writing, reading, and erasing) will be described hereinbelow referring to FIG. 22.

(a) Writing Operation (See FIG. 22*a*)

The drain region of the selected memory cell 201 is grounded via a constant current source 310*a* set within the sense amplifier 310. The voltage of the drain region is set to 1.2 V. The voltage of each drain region of the memory cells 201 which are not selected is set to 3 V.

The voltage of the control gate electrode 207 of the selected memory cell 201 is set to 2 V. The voltage of each control gate electrode of the memory cells 201 which are not selected is set to 0 V.

The voltages of all source regions 203 in all memory cells 201 are set to 12 V.

In the memory cell 201, a threshold voltage Vth of the selecting transistor 212 is approximately 0.5 V. Therefore, in the selected memory cell 201, electrons in the drain region 204 move to the channel region 205 in an inversion state. As a result, a cell current flows from the source region 203 to the drain region 204. On the other hand, the voltage of the source region is 12 V. Therefore, coupling through a capacity between the source region 203 and the floating gate electrode 206 raises the potential of the floating gate electrode closer to 12 V. As a consequence, a high potential field is created between the channel region 205 and the floating gate electrode 206. Therefore, electrons in the channel region 205 are accelerated to become hot electrons, and are injected to the floating gate electrode 206, as shown by an arrow A in FIG. 22*a*. As a result, electric charge is accumulated in the floating gate electrode 206 in the selected memory cell 201, and 1 bit data is thus written and stored.

This writing operation is carried out by each selected memory cell 201.

(b) Reading Operation (See FIG. 22*b*)

The potential of the drain region of the selected memory cell 201 is set to 2 V. The potentials of the drain regions 204 of the memory cells 201 which are not selected are set to 0 V.

The potential of the control gate electrode 207 of the selected memory cell 201 is set to 4V. The potentials of the control gate electrodes 207 of the memory cells 201 which are not selected are set to 0 V.

The potentials of the source regions 203 of the all memory cells 201 are set to 0 V.

As will be described later, electric charge is not stored in an erasing mode of the floating gate electrode 206 in the memory cell 201. On the other hand, as described above, electric charge is stored in the writing mode in the floating gate electrode 206 of the memory cell 201. Therefore, the channel region 205 under the floating gate electrode 206 of the memory cell 201 in the erasing mode is in an ON state, while the channel region 205 under the floating gate electrode 206 of the memory cell 201 in the writing mode is in an OFF state. As a consequence, when 4 V is applied to the control gate electrode 207 , the cell current, which flows from the drain region 204 to the source region 203, becomes larger in the memory cell 201 in the erasing mode than the memory cell 201 in the writing mode.

By distinguishing the magnitude of the cell current between each memory cell 201 using the sense amplifier 310, data stored in the memory cell 201 can be read. For example, reading is performed by setting the data value in the memory cell 201 to 1, the erasing mode, and by setting the data value of the memory cell 201 to 0, the writing mode. In other words, each memory cell 201 is forced to store one of the two values 1, which is the data value in the erasing mode, or 0, which is the data value in the writing mode, and the data value stored can be read.

(c) Erasing Operation (See FIG. 22*c*)

The potentials of the drain regions 204 of all memory cells 201 are set to 0 V.

The potential of the control gate electrode 207 of the selected memory cell 201 is set to 15 V. The potentials of the control gate electrodes 207 of the memory cells 201 which are not selected are set to 0 V.

The potentials of the source regions 203 of all memory cells 201 are set to 0 V.

The capacity between the source region 203/silicon substrate 202 and the floating gate electrode 206 is far greater than the capacity between the control gate electrode 207 and the floating gate electrode 206. In other words, the floating gate electrode 206 is strongly coupled with the source region 203 and the silicon substrate 202. Therefore, if the voltages of the control gate electrode 207 and the drain region 204 become 15 V and 0 V respectively, the voltage of the floating gate electrode does not change greatly from the 0 V. As a result, the potential difference between the control gate electrode 207 and the floating gate electrode 206 becomes larger, and a high potential field is created between the control gate electrode 207 and the floating gate electrode 206.

As a consequence, a Fowler-Nordheim Tunnel Current (hereafter called FN tunnel current) flows. Therefore, as shown by an arrow B in FIG. 22*c*, electrons in the floating gate electrode 206 are pulled toward the control gate electrode 207, and the data stored in the memory cell 201 is erased.

At this time, since the floating gate electrode 206 has protuberances 206*a*, the electrons in the floating gate electrode 206 rush out of the protuberances 206*a*, and move to the control gate 207. Therefore, the movement of the electrons become easier, and the electrons in the floating gate electrode 206 are effectively pulled out.

The control gate electrodes 207 in memory cells 201 which are laid out in columns form common word lines WL1–WLn. Therefore, erasing operation is carried out on all memory cells 201 connected to the selected word line WLn.

By simultaneously selecting a plurality of word lines WL1–WLn, all memory cells 201 connected to the selected word lines can be erased. As described above, an erasing operation by dividing memory cell arrays 302 into block units composed of a plurality of word lines WL1–WLn and then erasing data by each block is called block erasing.

A flash EEPROM 301 using split gate type memory cells 201, with the memory cells 201 being composed as described above, includes selecting transistors 212. Therefore, each memory cell 201 has a function to select itself. In other words, if the electrical charge is pulled out excessively from the floating gate electrode 206 when data is erased, the selecting gate 211 can set the channel region 205 to an OFF state. Therefore, even when an over erasing occurs, the selecting transistor 212 can control ON and OFF states of the memory cell, and over erasing problems do not occur. In other words ON or OFF state of the memory cell can be selected by the selecting transistor 212 set within the memory cell 201.

A method to produce the memory cell array 302 will be explained sequentially hereinbelow.

Step 1 (See FIG. 23*a*): Using the LOCOS method, the field insulating layer 213 (not shown) is formed on the silicon substrate 202. The gate insulating layer 208 which is composed of a silicon oxide layer is then formed, using a thermal oxidation method, on portions of the silicon substrate 202 where no field insulating layer 213 is formed (element regions). On the gate insulating layer 208, a doped polysilicon layer 215 which will become the floating gate electrode 206 is formed. Using an LPCVD method (Low Pressure Chemical Vapor Deposition), a silicon nitride layer 216 is then formed on the entire surface of the doped polysilicon layer 215. A photoresist coats the silicon nitride layer 216, and then an etching mask 217 to be used for the floating gate electrode 206 is formed using an ordinary photo lithography technique.

Step 2 (See FIG. 23*b*): The silicon nitride layer 216 is etched by anisotropy etching using the etching mask 217. The etching mask 217 is then detached. Using the LOCOS method, by oxidizing the doped polysilicon layer 215 using the etched silicon nitride layer 216 as an oxide mask, the insulating layer 209 is formed. At this time, edge portions of the insulating layer 209 intrude edge portions of the silicon nitride layer 216, and form bird's beaks 209*a*.

Step 3 (See FIG. 23*c*): The silicon nitride layer 216 is removed. The doped polysilicon layer 215 is etched by the anisotropy etching using the insulating layer 209 as the etching mask to form the floating gate electrodes 206. As bird's beaks 209*a* are formed on the edge portions of the insulating layer 209, the upper edge portions of the floating gate electrodes 206 become sharp, and form protuberances 206*a*.

Step 4 (See FIG. 23*d*): The insulating layer 210 composed of a silicon oxide layer is formed on the entire surface of the device composed as described above by the thermal oxidation method, or the LPCVD method, or a combination thereof. The stacked insulating layer 208 is unified with the insulating layer 210, and the insulating layer 209 is also unified with the insulating layer 210.

Step 5 (See FIG. 24*e*): On the entire surface of the device formed through the above-described steps, a doped polysilicon layer 218 which will become the control gate electrode 207 is formed.

Step 6 (See FIG. 24*f*): After photoresist coating on the entire surface of the device as described above, an etching mask 219, which will be used to form the control gate electrode 207, is formed using the ordinary photo lithography technique.

Step 7 (See FIG. 24*g*): The doped polysilicon layer 218 is etched and forms control gate electrodes 207 by the anisotropy etching using the etching mask 219. The etching mask 219 is then removed.

Step 8 (See FIG. 25*h*): After photoresist coating on the entire surface of the device through the above steps, a mask for ion injection 220 which will be used to form the source regions 203 is formed using the ordinary photo lithography technique. Using an ordinary ion injection method, phosphorous ions ($p^+$) are injected on the surface of the silicon substrate 202 so that source regions 203 are formed. The mask for ion injection 220 is then removed.

At this time, the mask for ion injection 220 should be formed so that it covers at least the regions on the silicon substrate 202, which will become the drain regions 204. The mask for the ion injection 220 should also be formed not to protrude beyond the floating gate electrodes 206. As a result, positions of the source region 203 are defined by the edge portions of the floating gate electrodes 206.

Step 9 (See FIG. 25*i*): After photoresist coating on the entire surface of the device as composed through the above-described steps, a mask for ion injection 221 which will be used to form the drain regions 204 is formed using the ordinary photo lithography technique. Using an ordinary ion injection method, arsenic ions ($As^+$) are injected on the surface of the silicon substrate 202 so that drain regions 204 are formed.

The mask for ion injection 221 should then be formed so as to cover at least the source regions 203 and so as not to protrude beyond the control gate electrodes 207. As a result, positions of the drain regions 204 are defined by the edge portions of the control gate electrodes 207 on the selecting gate 211 side.

After the mask for ion injection 221 is removed, the memory cell array 302 is completed.

Flash EEPROMs 301 using the split gate type memory cells 201 have the following problems.

(1) Due to misalignment of the etching mask 219 which will be used for forming the control gate electrodes 207, a fluctuation in writing characteristic of each memory cell 201 occurs.

As shown in FIG. 26*a*, in the above-described step 6, if the relative positions of the etching mask 219, which will be used to form the control gate electrodes 207, to the memory cells 201*a* and 201*b* are shifted from the originally designed position, the shapes of the control gate electrodes 207 formed in step 7 above will not be the same for memory cells 201*a* and 201*b*.

When the drain regions are formed in the above-described step 9 by the ion injection method, the positions of the drain regions 204 are defined by the edge portions of the control gate in the selecting gate 211 side.

Therefore, as shown by FIG. 26*a*, if the position of the etching mask 219 is shifted from the originally designed position, length L1 and L2 of the channel regions 205

(channel length) of the memory cells 201*a* and 201*b* are not the same as shown by FIG. 26*b*. However, even though the position of the etching mask 219 is shifted from the originally designed position, the width of the mask does not change. Thus, even though the shapes of the control gate electrodes 207 are not the same, the width of the control gate electrodes remains constant. For example, if the position of the etching mask 219 is shifted toward the memory cell 201*b*, the channel length L2 of the memory cell 201*b* is shorter then the channel length L1 of the memory cell 201*a*.

If channel length L1 and L2 differ, the resistance of the channel regions 205 will likewise differ. Therefore, cell current values will also be different in the writing operation. In other words, a longer channel length will result in larger resistance of the channel region 205, and smaller cell currents in the writing operation. If the cell currents which flow in the writing operation offer, the rate of hot electron generation will also differ. As a result, writing characteristics of the memory cells 201*a* and 201*b* will also differ.

(2) To prevent the problems described in (1), compacting memory cell 201 is hindered.

When designing the split gate type memory cell 201, alignment accuracy of each gate electrode 206 or 207 should be considered as well as patterning rule accuracy. Taking these factors into consideration, gate electrodes 206 and 207, and channel regions 203 and 204 should be positioned with some free space therebetween. However, in current production techniques of high density semiconductors, when an approximately 0.5 $\mu$/m wide line is processed, the patterning rule accuracy can be up to 0.05 $\mu$m, while the alignment accuracy is up to 0.1–0.2 $\mu$m. In other words, in the split gate type memory cell 201, the alignment accuracy of gate electrodes 206 or 207 prevents compacting the memory cell 201.

(3) The split gate type memory cell 201 is more difficult to compact than a stacked gate type memory cell.

In a stacked gate type memory cell, widths of both floating gate and control gate electrodes are equivalent, and both gate electrodes are stacked without a position shift. On the other hand, in the split gate type memory cell 201, one portion of the control gate electrode 207 is laid out over the channel region 205 so that they form the selecting gate 211. Therefore, in the split gate type memory cell 201, the occupied area of the elements is larger by the area of the selecting gate 211 than in the stacked gate type memory cell. In other words, even though split gate type memory cells do not have problems with over erase, they are more difficult in higher integration than stacked gate type memory cells, due to the problems described in (2) and (3).

(4) The memory cell array 302 using the split gate type memory cell 201 is complex in structure and time consuming to produce.

SUMMARY OF THE INVENTION

The present invention addresses the above-described problems and has the following objects:

1] To provide a transistor with no fluctuation in writing characteristic, with capability of compacting, with no over erase problems, and with a simple configuration;

2] To provide a transistor array using such transistors and its producing method;

3] To provide a nonvolatile semiconductor memory using such transistors as memory cells; and 4] To provide a nonvolatile semiconductor memory using such transistor arrays as memory cell arrays.

A transistor related to the present invention comprising floating gate electrodes in which an electric charge is infected comprises two source-drain regions formed on a semiconductor substrate, an insulating layer on the semiconductor substrate, two floating gate electrodes formed next to each other on the insulating layer and placed between the two source-drain regions, and a common control gate electrode placed on an upper layer of the two floating gate electrodes, wherein a capacity between the floating gate electrodes and the semiconductor substrate is set larger than a capacity between the floating gate electrodes and the control gate electrode.

The transistor may include a semiconductor substrate comprising a first and a second source-drain regions, a channel region placed between the first and the second source-drain regions, a gate insulating layer on the semiconductor substrate, a first floating gate electrode placed near the first source-drain region and formed on the gate insulating layer, a second floating gate electrode placed next to the first floating gate electrode and near the second source-drain region and formed on the gate insulating layer, an insulating layer on the first and the second floating gate electrodes, and a control gate electrode on the insulating layer, wherein a capacity between the floating gate electrodes and the semiconductor substrate is set larger than a capacity between the floating gate electrodes and the control gate electrode.

In such transistor, the configuration of the second source-drain region may be symmetric with the first source-drain region, while the second floating gate electrode may be of size and shape exactly the same as the size and shape of the first floating gate electrode.

Such a transistor may further comprise protuberances in upper portions of the first and second floating gate electrodes.

The transistor may further comprise a selecting gate electrode extended from the control gate electrode and placed on the gate insulating layer between the first and second floating gate electrodes.

In another such transistor, when data is written in said second floating gate electrode by injection of electric charge, the predetermined amount of electric charge to be stored in the first floating gate electrode is set so that a cell current necessary for writing data flows in the second floating gate electrode.

In another such above transistor, when data is written in said second floating gate electrode by injection of electric charge, a cell current flows from the second source-drain region to the first source-drain region, a high potential field is created between the channel region and the second floating gate electrode due to coupling via a capacity between the second source-drain region and the second floating gate electrode, electrons in the channel region are accelerated to become hot electrons, electric charge is stored in the second floating gate electrode by the hot electrons injected in the second floating gate electrode, and data corresponding to the electric charge is written and stored thereby.

In another such transistor, when data is written in said second floating gate electrode by injection of electric charge, the first source-drain region is grounded via a constant current source, a second voltage lower than a first voltage is applied to the second source-drain region, a cell current flows from the second source-drain region to the first source-drain region, a potential at the second floating gate electrode is raised by coupling via a capacity between the second source-drain region and the second floating gate electrode, a high potential field is created between the channel region and the second floating gate electrode, electrons in the channel region are accelerated to become hot electrons, electric charge is stored in the second floating gate electrode by injection of the hot electrons to the second floating gate electrode, data corresponding to the electric charge is written and stored thereby, a potential of the first floating gate electrode is raised by coupling via a capacity between the first source drain region and the first floating gate electrode, hot electrons are substantially none injected to the first floating gate electrode however due to a low potential of the first floating gate electrode.

In another such transistor, the electric charge stored in the second floating gate electrode is adjusted by adjustments of said cell current and injection duration of hot electrons to the second floating gate electrode, and the electric charge stored in the second floating gate electrode is set to a small value so that no overwriting state will occur.

In another such transistor, the electric charge stored in the second floating gate electrode is adjusted by adjustment of said cell current and injection duration of hot electrons to the second floating gate electrode, and the electric charge stored in the second floating gate electrode is set to a large value so that the overwriting state will occur, and at least one of the first floating gate electrode's gate length or an impurity concentration of the substrate is set so that a certain value leak current corresponding to the cell current will flow in the channel region under the first floating gate electrode.

In another such transistor, the channel region superposed by the first floating gate electrode is set to an ON state due to coupling via the capacity between the first source-drain region and the first floating gate electrode regardless of a state of the electric charge stored in the first floating gate, and the data stored in the second floating gate electrode is read based on the cell current flowing from the first source-drain region to the second source-drain region.

In another such transistor, the channel region superposed by the first floating gate electrode maintains an ON state due to coupling via the capacity between the first source-drain region and the first floating gate electrode regardless of a state of the electric charge stored in the first floating gate, the channel region superposed by the second floating gate electrode in an erasing mode is set to an ON state, the channel region superposed by the second floating gate electrode in a writing mode becomes close to an OFF state, and data stored in the second floating gate electrode is read by judgment of the writing state or the erasing state of the second floating gate electrode based on the value of the cell current flowing between the first source-drain region and the second source-drain region.

In another such transistor, a third voltage is applied to the first source-drain region, a fourth voltage lower than the third voltage is applied to the second source-drain region, a fifth voltage is applied to the control gate electrode, a potential of the first floating gate electrode is raised by coupling via the capacity between the first source-drain region and the first floating gate electrode, the channel region superposed by the first floating gate electrode is set to an ON state regardless of a state of electric charge stored in the first floating gate electrode, the channel region superposed by the second floating gate electrode in an erasing mode in which no electric charge is stored is set to an ON state, the channel region superposed by the second floating gate electrode in a writing mode in which electric charge is stored is set close to an OFF state, and data stored in the second floating gate electrode is read by judgment of the writing state or the erasing state of the second floating gate electrode based on the value of the cell current flowing between the first source-drain region and the second source-drain region.

In another such transistor, a sixth voltage is applied to the first and the second source-drain regions, a seventh voltage higher than the sixth voltage is applied to the control gate electrode, potentials of the first and the second floating gate electrodes are substantially maintained at the sixth voltage because of the first and the second floating gate electrodes being strongly coupled with the first and the second source-drain regions, a potential difference between the control gate electrode and the first and second floating gate electrodes is made large, a high potential electric field is created between the control gate and the first and the second floating gate electrodes, letting a Fowler-Nordheim tunnel current flow therebetween, electrons in the first and the second floating gate electrodes are thus pulled toward the control gate electrode, and data stored in the first and second floating gate electrodes is erased.

In another such transistor, a sixth voltage is applied to the first and second source-drain regions, a seventh voltage higher than the sixth voltage is applied to the control gate electrode, potentials of the first and the second floating gate electrodes are substantially maintained at the sixth voltage because of the first and the second floating gate electrodes being strongly coupled with the first and the second source-drain regions, a potential difference between the control gate electrode and the first and the second floating gate electrodes is made large, a high potential electric field is created between the control gate and the first and the second floating gate electrodes, letting a Fowler-Nordheim tunnel current flow therebetween, electrons in the first and the second floating gate electrodes are thus jumped to the control gate electrode from upper protuberances thereof, and data stored in the first and the second floating gate electrodes is erased.

A transistor array comprising a plurality of transistors related to the present invention laid out in a matrix comprises transistors laid out in a matrix, word lines by which the transistors are laid out in the matrix and control gate electrodes of the transistors laid out toward columns of the matrix are commonly connected, and bit lines commonly connecting source-drain regions of the transistors laid out toward rows of the matrix, the transistor comprising two source-drain regions formed on a semiconductor substrate, an insulating layer on the semiconductor substrate, two floating gate electrodes formed next to each other on the insulating layer and placed between the two source-drain regions, and a common control gate electrode placed on an upper layer of the two floating gate electrodes.

Each transistor laid out toward columns may have a pair of bit lines independent from the bit lines of the neighboring transistor.

The transistor array may be divided into a plurality of columns of cell blocks and a source-drain region commonly shared by a pair of transistors laid out toward columns in each cell block may be connected by a bit line.

The above transistor array may comprise local short bit lines by which the transistor array is divided into a plurality of rows of cell blocks and the source-drain regions of the transistors laid out toward rows of each cell block are commonly connected, and global bit lines corresponding to each local short bit line, with each local short bit line being connected with each global bit line in each cell block via a switching element.

In such a transistor array, the floating gate electrodes of each transistor connected to the common word line may be laid out in series to form an AND-NOR type configuration wherein the circuit thereof is laid out in parallel to the commonly connecting bit line.

A method for manufacturing the transistor related to the present invention comprising floating gate electrodes in which electric charge is injected comprises the steps of forming a gate insulating layer on a semiconductor substrate, forming a first conductive layer on the gate insulating layer, patterning a first and a second floating gate electrodes parallel to each other over the semiconductor substrate by etching the first conductive layer, forming a first and a second source-drain region over the semiconductor substrate by injecting impurity ions after masking the area from the first floating gate electrode to the second floating gate electrode, forming an insulating layer on the floating gate electrodes, forming a second conductive layer on the insulating layer, and patterning the control gate electrode using the second conductive layer, and the first and the second floating gate electrodes using the first conductive layer, after etching the second conductive layer, the insulating layer, and the first conductive layer, in that order.

A memory array wherein a plurality of other memory cells related to the present invention are laid out in a matrix comprises memory cells, word lines by which the memory cells are laid out in the matrix and control gate electrodes of the memory cells laid out toward columns of the matrix are commonly connected, and a bit line commonly connecting source-drain regions of the memory cells laid out toward rows of the matrix, the memory cell comprising two source-drain regions formed on a semiconductor substrate, an insulating layer on the semiconductor substrate, two floating gate electrodes formed next to each other on the insulating layer and placed between the two source-drain regions, and a common control gate electrode placed on an upper layer of the two floating gate electrodes.

A method for manufacturing a nonvolatile semiconductor memory cell related to the present invention comprising other floating gate electrodes in which electric charge is injected comprises the steps of forming a gate insulating layer on a semiconductor substrate, forming a first conductive layer on the gate insulating layer, patterning a first and a second floating gate electrode parallel to each other over the semiconductor substrate by etching the first conductive layer, forming a first and a second source-drain region over the semiconductor substrate by injecting impurity ions after masking the area from the first floating gate electrode to the second floating gate electrode, forming an insulating layer on the floating gate electrodes, forming a second conductive layer on the insulating layer, and patterning the control gate electrode using the second conductive layer, and the first and second floating gate electrodes using the first conductive layer, after etching the second conductive layer, the insulating layer, and the first conductive layer in this order.

In another transistor related to the present invention, when data is written in a second floating gate electrode by injection of an electric charge therein, a predetermined electric charge amount to be stored in a first floating gate electrode is set so that a cell current necessary for writing data in the second floating gate electrode flows.

In still another transistor related to the present invention, when data is written in a second floating gate electrode by injection of an electric charge therein, a predetermined electric charge amount to be stored in a first floating gate electrode is set so that a cell current necessary for writing data in the second floating gate electrode flows.

The above transistor in the transistor array may further comprise the second source-drain region whose configuration is symmetric to the first source-drain region, and the second floating gate electrode whose shape and size are exactly the same as the shape and size of the first floating gate electrode.

Such a transistor in the transistor array may further comprise protuberances in upper portions of the first and second floating gate electrodes.

The transistor in the transistor array may further comprise a selecting gate electrode extended from the control gate electrode and placed on the gate insulating layer between the first and the second floating gate electrodes.

In such a transistor in the transistor array, when data is written in said second floating gate electrode by injection of electric charge, a predetermined electric charge amount to be stored in the first floating gate electrode may be set so that a cell current necessary for writing data flows in the second floating gate electrode.

In another such transistor in the transistor array, when data is written in said second floating gate electrode by injection of electric charge, a cell current flows from the second source-drain region to the first source-drain region, a high potential field is created between the channel region and the second floating gate electrode due to coupling via a capacity between the second source-drain region and the second floating gate electrode, electrons in the channel region are accelerated to become hot electrons, electric charge is stored in the second floating gate electrode by the hot electrons injected in the second floating gate electrode, and data corresponding to the electric charge is written and stored thereby.

In another such transistor in the transistor array, when data is written in said second floating gate electrode by injection of electric charge, the first source-drain region is grounded via a constant current source, a second voltage lower than a first voltage is applied to the second source-drain region, a cell current flows from the second source-drain region to the first source-drain region, a potential at the second floating gate electrode is raised by coupling via a capacity between the second source-drain region and the second floating gate electrode, a high potential field is created between the channel region and the second floating gate electrode, electrons in the channel region are accelerated to become hot electrons, electric charge is stored in the second floating gate electrode by injection of the hot electrons to the second floating gate electrode, data corresponding to the electric charge is written and stored thereby, a potential of the first floating gate electrode is raised by coupling via a capacity between the first source-drain region and the first floating gate electrode, hot electrons are substantially none injected to the first floating gate electrode however due to a low potential of the first floating gate electrode.

In another such transistor in the transistor array, the electric charge stored in the second floating gate electrode is adjusted by adjustments of said cell current and injection duration of hot electrons to the second floating gate electrode, and the electric charge stored in the second floating gate electrode is set to a small value so that no overwriting state will occur.

In another such transistor in the transistor array, the channel region superposed by the first floating gate electrode enters an ON state due to coupling via the capacity between the first source-drain region and the first floating gate electrode regardless of a state of the electric charge stored in the first floating gate, and the data stored in the second floating gate electrode is read based on the cell current flowing from the first source-drain region to the second source-drain region.

In another such transistor in the transistor array, the channel region superposed by the first floating gate electrode maintains an ON state due to coupling via the capacity between the first source-drain region and the first floating gate electrode regardless of a state of the electric charge stored in the first floating gate, the channel region superposed by the second floating gate electrode in an erasing mode is set to an ON state, the channel region superposed by the second floating gate electrode in a writing mode becomes close to an OFF state, and data stored in the second floating gate electrode is read by judgment of the writing state or the erasing state of the second floating gate electrode based on the value of the cell current flowing between the first source-drain region and the second source-drain region.

In another such transistor in the transistor array, a third voltage is applied to the first source-drain region, a fourth voltage lower than the third voltage is applied to the second source-drain region, a fifth voltage is applied to the control gate electrode, a potential of the first floating gate electrode is raised by coupling via the capacity between the first source-drain region and the first floating gate electrode, the channel region superposed by the first floating gate electrode is set to an ON state regardless of a state of electric charge stored in the first floating gate electrode, the channel region superposed by the second floating gate electrode in an erasing mode in which no electric charge is stored is set to an ON state, the channel region superposed by the second floating gate electrode in a writing mode in which electric charge is stored is set close to an OFF state, and data stored in the second floating gate electrode is read by judgment of the writing state or the erasing state of the second floating gate electrode based on the value of the cell current flowing between the first source-drain region and the second source-drain region.

In another such transistor in the transistor array, a sixth voltage is applied to the first and second source-drain regions, a seventh voltage higher than the sixth voltage is applied to the control gate electrode, potentials of the first and second floating gate electrodes are substantially maintained at the sixth voltage because of the first and second floating gate electrodes being strongly coupled with the first and second source-drain regions, a potential difference between the control gate electrode and the first and second floating gate electrodes is made large, a high potential electric field is created between the control gate and the first and second floating gate electrodes, letting a Fowler-Nordheim tunnel current flow therebetween, electrons in the first and the second floating gate electrodes are thus pulled toward the control gate electrode, and data stored in the first and the second floating gate electrodes is erased.

In another such transistor in the transistor array, a sixth voltage is applied to the first and second source-drain regions, a seventh voltage higher than the sixth voltage is applied to the control gate electrode, potentials of the first and second floating gate electrodes are substantially maintained at the sixth voltage because of the first and second floating gate electrodes being strongly coupled with the first and second source-drain regions, a potential difference between the control gate electrode and the first and second floating gate electrodes is made large, a high potential electric field is created between the control gate and the first and second floating gate electrodes, letting a Fowler-Nordheim tunnel current flow therebetween, electrons in the first and second floating gate electrodes are thus jumped to the control gate electrode from thereof, and data stored in the first and second floating gate electrodes is erased.

A semiconductor memory related to the present invention wherein data is written by injecting electric charge into floating gate electrodes thereof comprises two source-drain regions formed on a semiconductor substrate, an insulating layer on the semiconductor substrate, two floating gate electrodes placed next to each other on the insulating layer and positioned between the two source-drain regions, and a common control gate electrode placed on an upper layer of the two floating gate electrodes, wherein data is erased by pulling the electric charge injected in the floating gate electrodes toward the control gate electrode.

The above semiconductor memory may further comprise a second source-drain region whose configuration is symmetric to the first source-drain region, and a second floating gate electrode whose shape and size are exactly the same as the shape and size of the first floating gate electrode.

The above semiconductor memory may further comprise protuberances in upper portions of the first and second floating gate electrodes.

The above semiconductor memory may further comprise a selecting gate electrode extended from the control gate electrode and placed on the gate insulating layer between the first and second floating gate electrodes.

In one such semiconductor memory, when data is written in said second floating gate electrode by injection of electric charge therein, a predetermined electric charge amount to be stored in the first floating gate electrode is set so that a cell current necessary for writing data lows in the second floating gaze electrode.

In another such semiconductor memory, when data is written in said second floating gate electrode by injection of electric charge therein, a cell current flows from the second source-drain region to the first source-drain region, a high potential field is created between the channel region and the second floating gaze electrode due to coupling via a capacity between the second source-drain region and the second floating gate electrode, electrons in the channel region are accelerated to become hot electrons, electric charge is stored in the second floating gate electrode by the hot electrons injected in the second floating gate electrode, and data corresponding to the electric charge is written and stored thereby.

In another such semiconductor memory, when data is written in said second floating gate electrode by injection of electric charge therein, the first source-drain region is grounded via a constant current source, a second voltage lower than a first voltage is applied to the second source-drain region, a cell current flows from the second source-drain region to the first source-drain region, a potential at the second floating gate electrode is raised by coupling via a capacity between the second source-drain region and the second floating gate electrode, a high potential field is created between the channel region and the second floating gate electrode, electrons in the channel region are accelerated to become hot electrons, electric charge is stored in the second floating gate electrode by injection of the hot electrons to the second floating gate electrode, data corresponding to the electric charge is written and stored thereby, a potential of the first floating gate electrode is raised by coupling via a capacity between the first source-drain region and the first floating gate electrode, and no substantial hot electrons are made injected to the first floating gate electrode however due to a low potential of the first floating gate electrode.

In another such semiconductor memory, the electric charge stored in the second floating gate electrode is adjusted by adjustments of said cell current and injection duration of hot electrons to the second floating gate electrode, and the electric charge stored in the second floating gate electrode is set to a small value so that no overwriting state will exist.

In another such semiconductor memory, the channel region superposed by the first floating gate electrode enters an ON state due to coupling via the capacity between the first source-drain region and the first floating gate electrode regardless of a state of the electric charge stored in the first floating gate, and the data stored in the second floating gate electrode is made to be read based on the cell current flowing from the first source-drain region to the second source-drain region.

In another such semiconductor memory, the channel region superposed by the first floating gate electrode maintains an ON state due to coupling via the capacity between the first source-drain region and the first floating gate electrode regardless of a state of the electric charge stored in the first floating gate, the channel region superposed by the second floating gate electrode in an erasing mode is set to an ON state, the channel region superposed by the second floating gate electrode in a writing mode becomes close to an OFF state, and data stored in the second floating gate electrode is made to be read by judgment of the writing state or the erasing state of the second floating gate electrode based on the value of the cell current flowing between the first source-drain region and the second source-drain region.

In another such semiconductor memory, a third voltage is applied to the first source-drain region, a fourth voltage lower than the third voltage is applied to the second source-drain region, a fifth voltage is applied to the control gate electrode, a potential of the first floating gate electrode is raised by coupling via the capacity between the first source-drain region and the first floating gate electrode, the channel region superposed by the first floating gate electrode is set to an ON state regardless of a state of electric charge stored in the first floating gate electrode, the channel region superposed by the second floating gate electrode in an erasing mode in which no electric charge is stored is set to an ON state, the channel region superposed by the second floating gate electrode in a writing mode in which electric charge is stored is set close to an OFF state, and data stored in the second floating gate electrode is made to be read by judgment of the writing state or the erasing state of the second floating gate electrode based on the value of the cell current flowing between the first source-drain region and the second source-drain region.

In another such semiconductor memory, a sixth voltage is applied to the first and second source-drain regions, a seventh voltage higher than the sixth voltage is applied to the control gate electrode, potentials of the first and second floating gate electrodes are substantially maintained at the sixth voltage because of the first and the second floating gate electrodes being strongly coupled with the first and the second source-drain regions, a potential difference between the control gate electrode and the first and the second floating gate electrodes is made large, a high potential electric field is created between the control gate and the first and second floating gate electrodes, letting a Fowler-Nordheim tunnel current flow therebetween, electrons in the first and the second floating gate electrodes are thus pulled toward the control gate electrode, and data stored in the first and second floating gate electrodes is made to be erased.

In another such semiconductor memory, a sixth voltage is applied to the first and the second source-drain regions, a seventh voltage higher than the sixth voltage is applied to the control gate electrode, potentials of the first and the second floating gate electrodes are substantially maintained at the sixth voltage because of the first and the second floating gate electrodes being strongly coupled with the first and the second source-drain regions, a potential difference between the control gate electrode and the first and the second floating gate electrodes is made large, a high potential electric field is created between the control gate and the first and second floating gate electrodes, letting a Fowler-Nordheim tunnel current flow therebetween, electrons in the first and the second floating gate electrodes are thus jumped to the control gate electrode from thereof, and data stored in the first and the second floating gate electrodes is made to be erased.

BRIEF DESCRIPTION OF THE DRAWINGS

FIGS. 9*a*-1 and 9*b*-1 are top views thereof.

FIGS. 10*c*-1 and 10*d*-1 are top views thereof.

FIGS. 11*e*-1 and 11*f*-1 are top views thereof.

FIGS. 12*g*-1 and 12*h*-1 are top views thereof.

DESCRIPTION OF THE PREFERRED EMBODIMENTS

First Embodiment

Hereafter, a first embodiment implementing the present invention will be described referring to the accompanying drawings.

Figure 1A:
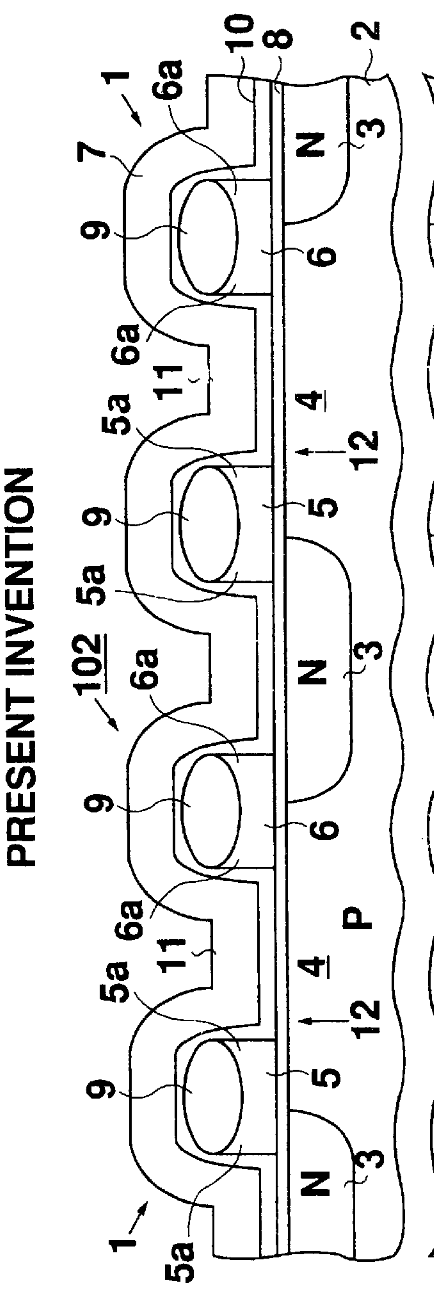
FIG. 1*a* is a cross section view of the present invention cut by the line Y—Y in FIG. 1*b*.

FIG. 1*a* is a partial cross section of a memory cell array 102 in a flash EEPROM 101 using a memory cell 1 of the present invention.

The memory cell 1 (transistors) comprises two source-drain regions 3, a channel region 4, two floating gate electrodes 5 and 6, and a control gate electrode 7.

The N type source-drain region 3 is formed on a P type monocrystalline silicon substrate 2. On the channel region 4 between the two source-drain regions laid out symmetrically, two floating gate electrodes 5 and 6 with the same size and shape are laid out next to each other on a gate insulating layer 8. On the floating gate electrodes 5 and 6, the control gate electrode 7 lies on an insulating layer 9 and insulating layer 10, both of the layers having been formed by the LOCOS method. By the insulating layer 9, an upper portion of each floating gate electrode 5 or 6 have protuberances 5*a* and 6*a*.

One portion of the control gate electrode 7 is laid over the channel region 4 on the insulating layers 8 and 10, and forms a selecting gate 11. A selecting transistor 12 comprises the selecting gate 11 and the source-drain regions 3 between which the selecting gate 11 lies. In other words, the memory cell 1 comprises two transistors and the selecting transistor 12 formed between the two transistors, both kinds of transistors laid out in series, the transistors comprising the floating gate electrodes 5 and 6, the control gate electrode 7, and each source-drain region 3.

A memory cell array (a transistor array) 102 comprises a plurality of memory cells 1 formed on the substrate 2. To reduce the occupied area on the substrate 2, memory cells 1 neighboring each other share the source-drain region 3.

Figure 1B:
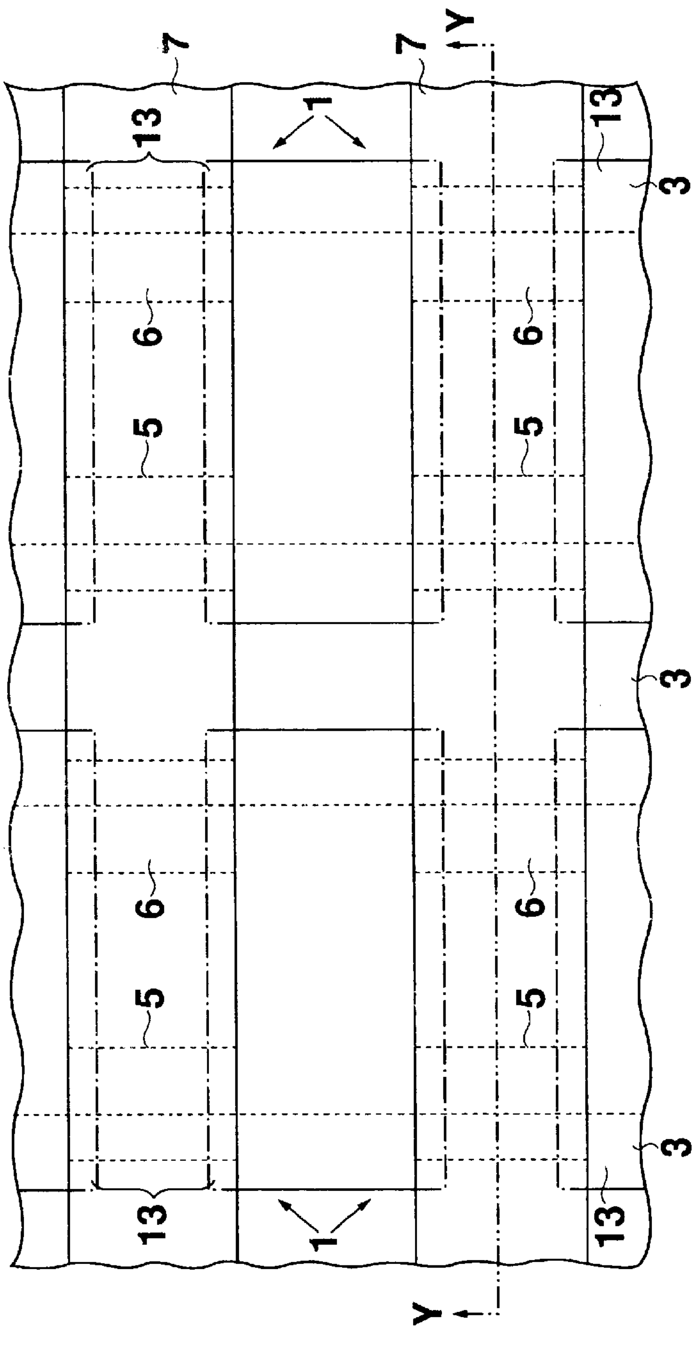
FIG. 1*b* is a top view thereof.

FIG. 1*b* is a partial plain view of the memory cell array 102. FIG. 1*a* is a cross section of FIG. 1*b* cut by the line Y—Y.

A field insulating layer 13 is formed on the substrate 2 which separates elements of each memory cell 1.

The source-drain regions 3 of memory cells 1 laid out vertically in FIG. 1*b* are shared and form common bit lines. The control gate electrodes 7 of memory cells 1 laid out horizontally in FIG. 1*b* are shared and form common word lines.

Figure 2:
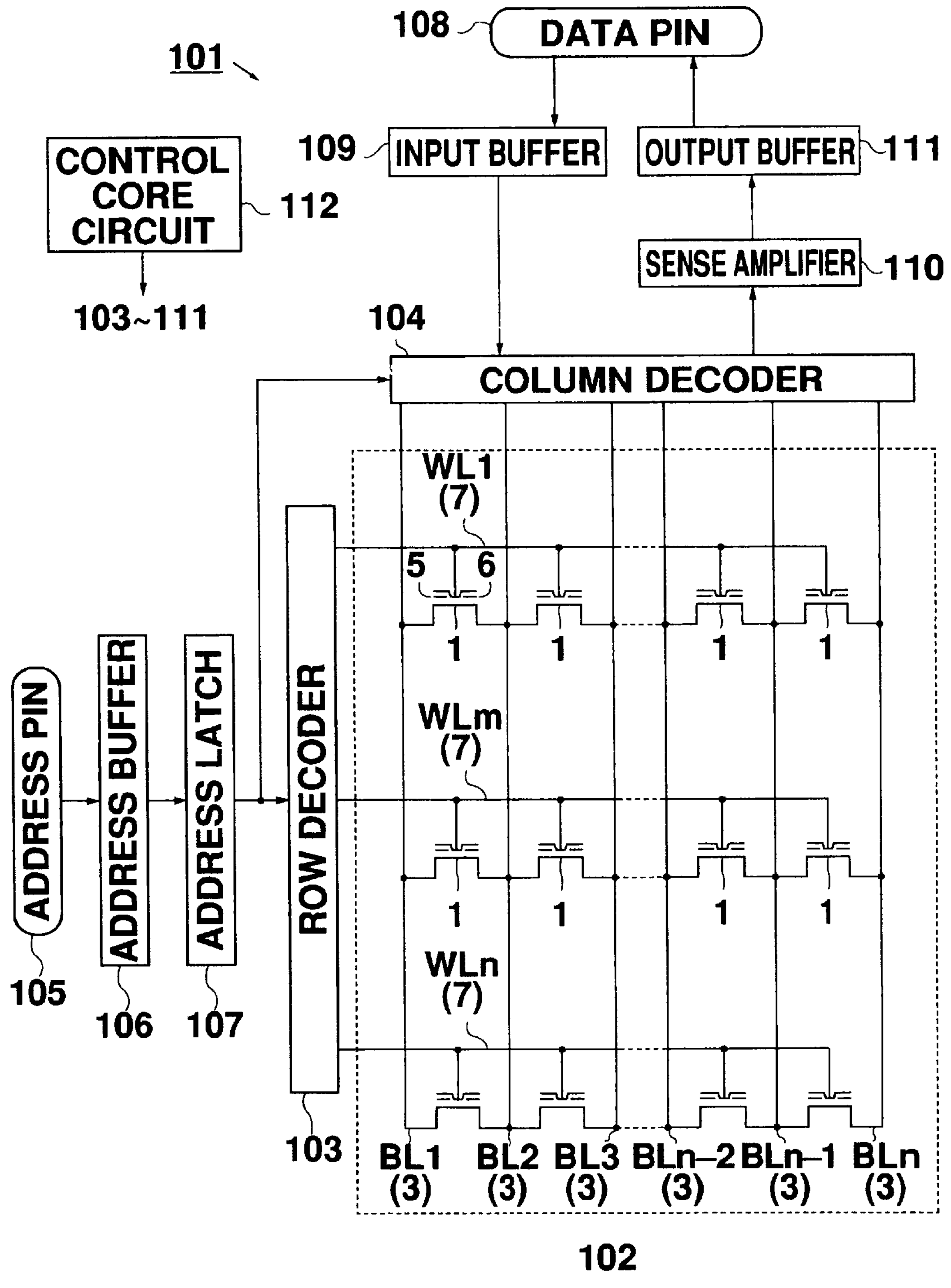
FIG. 2 is a diagram showing an outline of a memory array comprising the transistors in accordance with the present invention.

FIG. 2 shows the entire configuration of the flash EEPROM 101 using the memory cells.

The memory cell array 102 is composed of a plurality of memory cells 1 laid out in a matrix. The control gate electrodes 7 of the memory cells 1 laid out in columns form the common word lines WL1–WLn. The source-drain regions 3 of the memory cells 1 laid out in rows form the common bit lines BL1–BLn.

In other words, the memory cell array 102 has an AND-NOR type configuration with the floating gate electrodes 5 and 6 of the memory cell 1 laid out in series and connected to the common word lines WL1–WLn, the circuit of said floating gate electrodes being connected to the common bit lines BL1–BLn.

Each word line WL1–WLn is connected to a row decoder 103, and each bit line BL1–BLn is connected to a column decoder 104.

Row and column addresses specified by an external source are input to an address pin 105. The row and column addresses are transferred from the address pin 105 to an address latch 107 via an address buffer 106. Among the addresses latched by the address latch 107, the row address is transferred to the row decoder, while the column address is transferred to the column decoder. The address latch 107 may be omitted.

The row decoder 103 selects one word line WL1–WLn [for example, WLm (not shown)] corresponding to the row address latched by the address latch 107, and controls a potential of each word line WL1–WLn corresponding to a later-described operation mode. In other words, the potential of the control gate electrode 7 in each memory cell 1 is controlled by controlling the potentials of the word lines WL1–WLn.

To select one bit line BL1–BLn [for example, BLm (not shown) corresponding to the column address latched by the address latch 107, the column decoder 104 controls a potential or an open state of each bit line BL1–BLn corresponding to a later-described operation mode. In other words, by controlling the potentials or the open states of the bit lines BL1–BLn, the potential or the open state of the source-drain region 3 in each memory cell 1 is controlled.

Data specified by an external source is input to data pin 108. The data is transferred from the data pin 108 to the column decoder 104 via an input buffer 109. The column decoder 104 controls the potential or the open state of each bit line BL1–BLn corresponding to the data, as will be described later.

Data read from any memory cell 1 is transferred from the bit line BL1–BLn to a sense amplifier 110 via the column decoder 104. The sense amplifier 110 is a current sense amplifier. The column decoder 104 connects the bit line BL1–BLn selected thereby with the sense amplifier 110. The data distinguished by the sense amplifier 110 is applied from an output buffer 111 to the outside via the data pin 108.

The operations of the circuits (103–111) as described in the above are controlled by a control core circuit 112.

Figure 3:
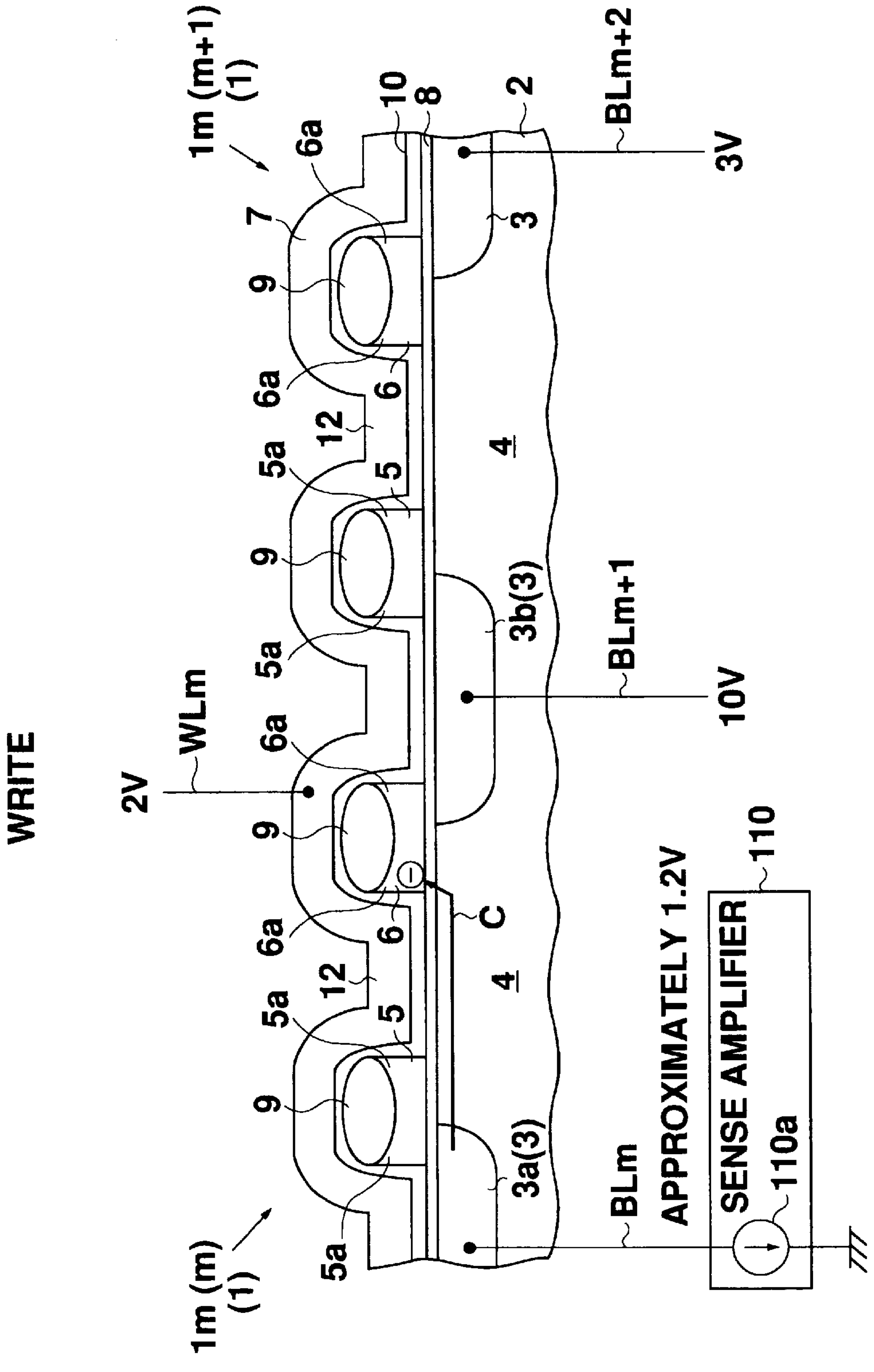
FIG. 3 is a cross section view of the present invention in a writing mode.
Figure 5:
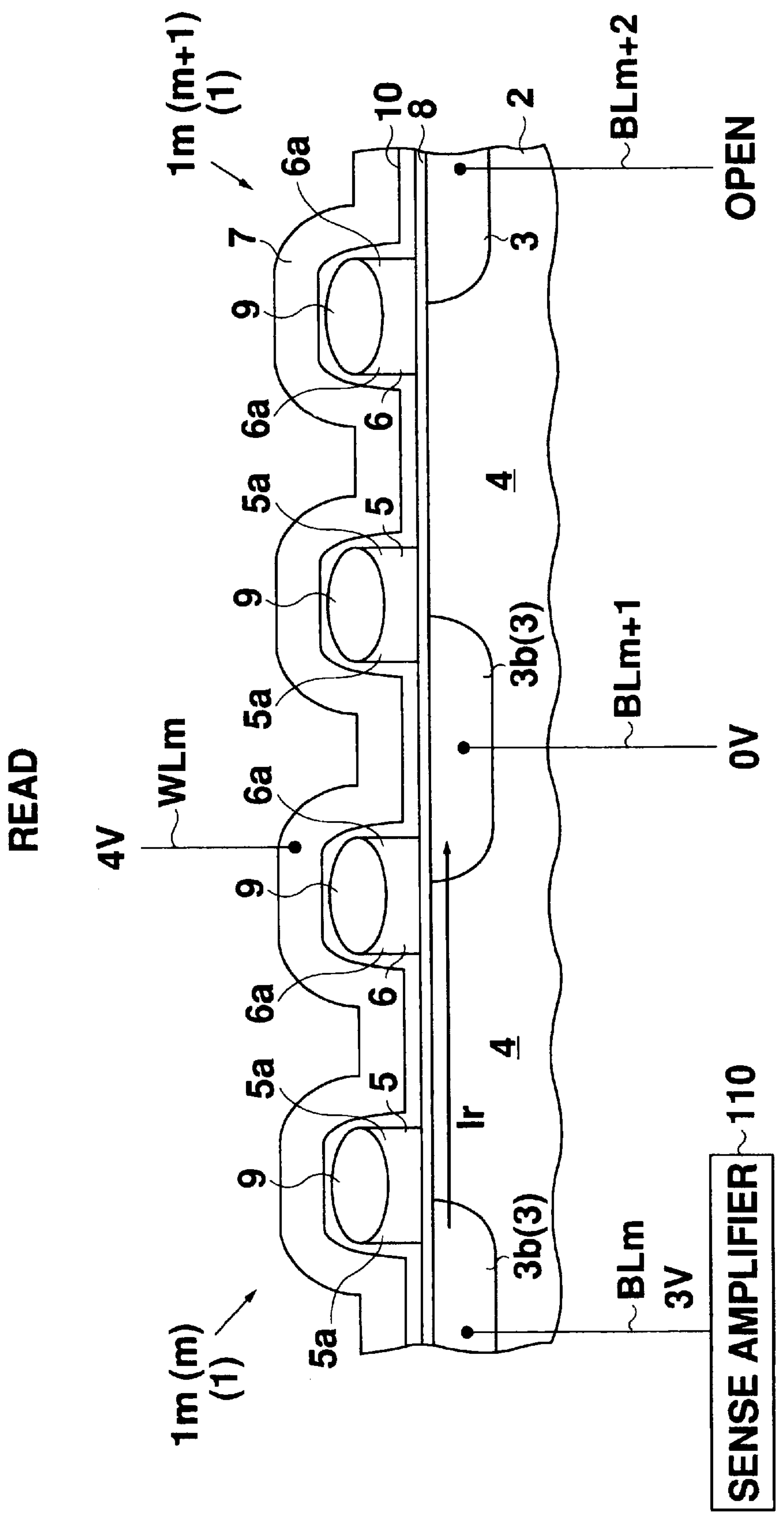
FIG. 5 shows a cross section of the present invention in a reading mode.
Figure 6:
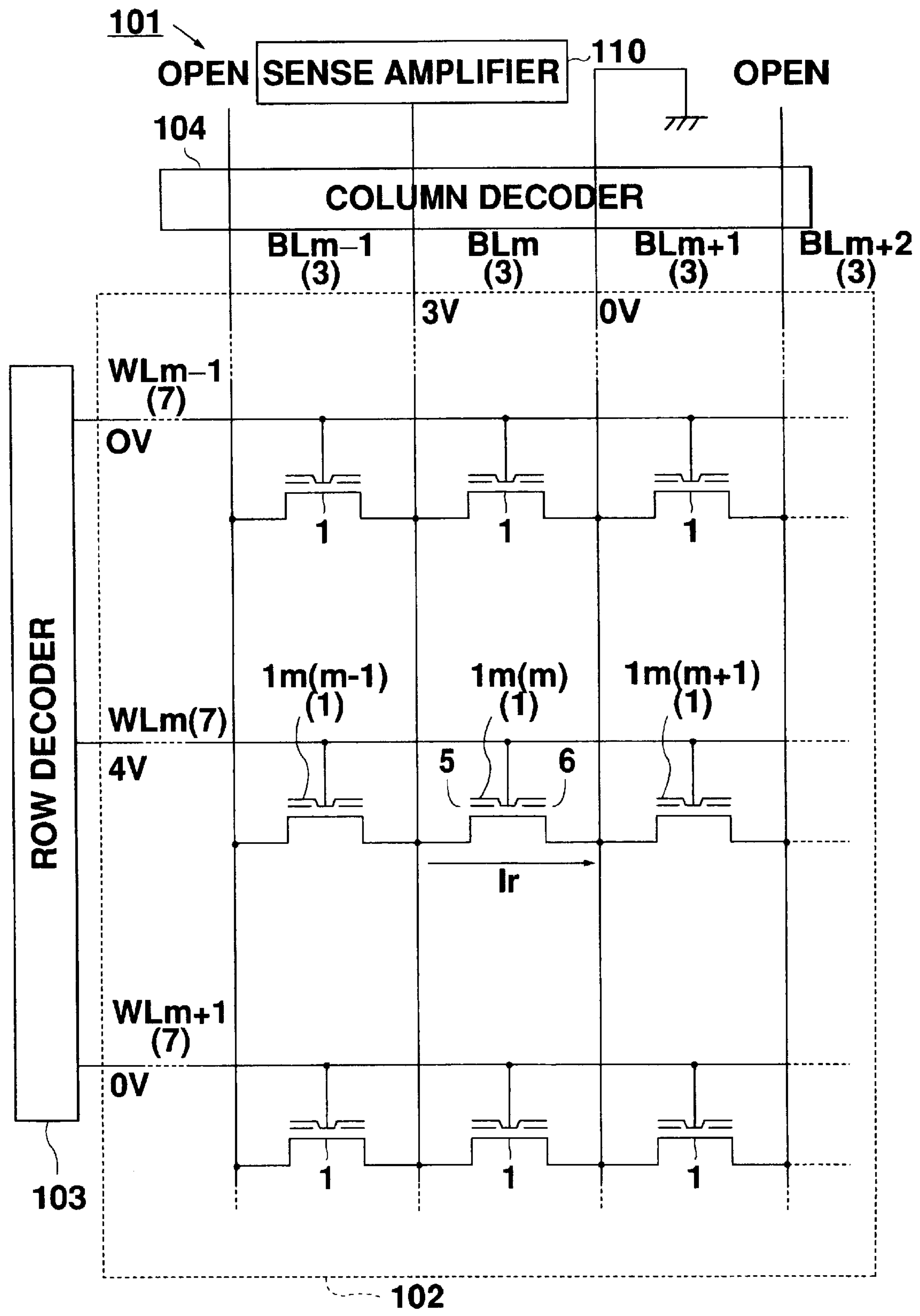
FIG. 6 is a diagram showing an outline of a memory array in the reading mode comprising the transistors in accordance with the present invention.
Figure 7:
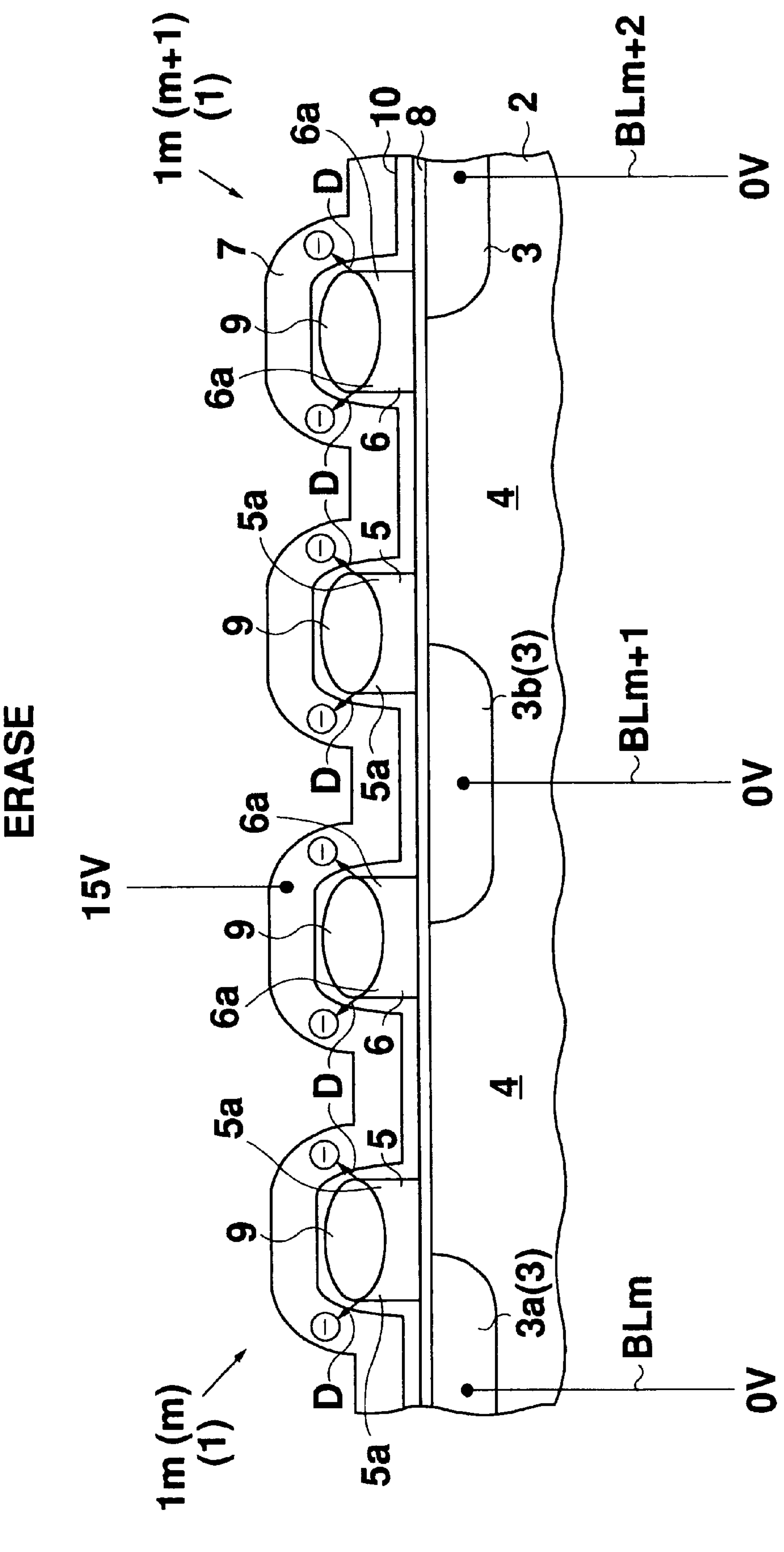
FIG. 7 shows a cross section of the present invention in an erasing mode.
Figure 8:
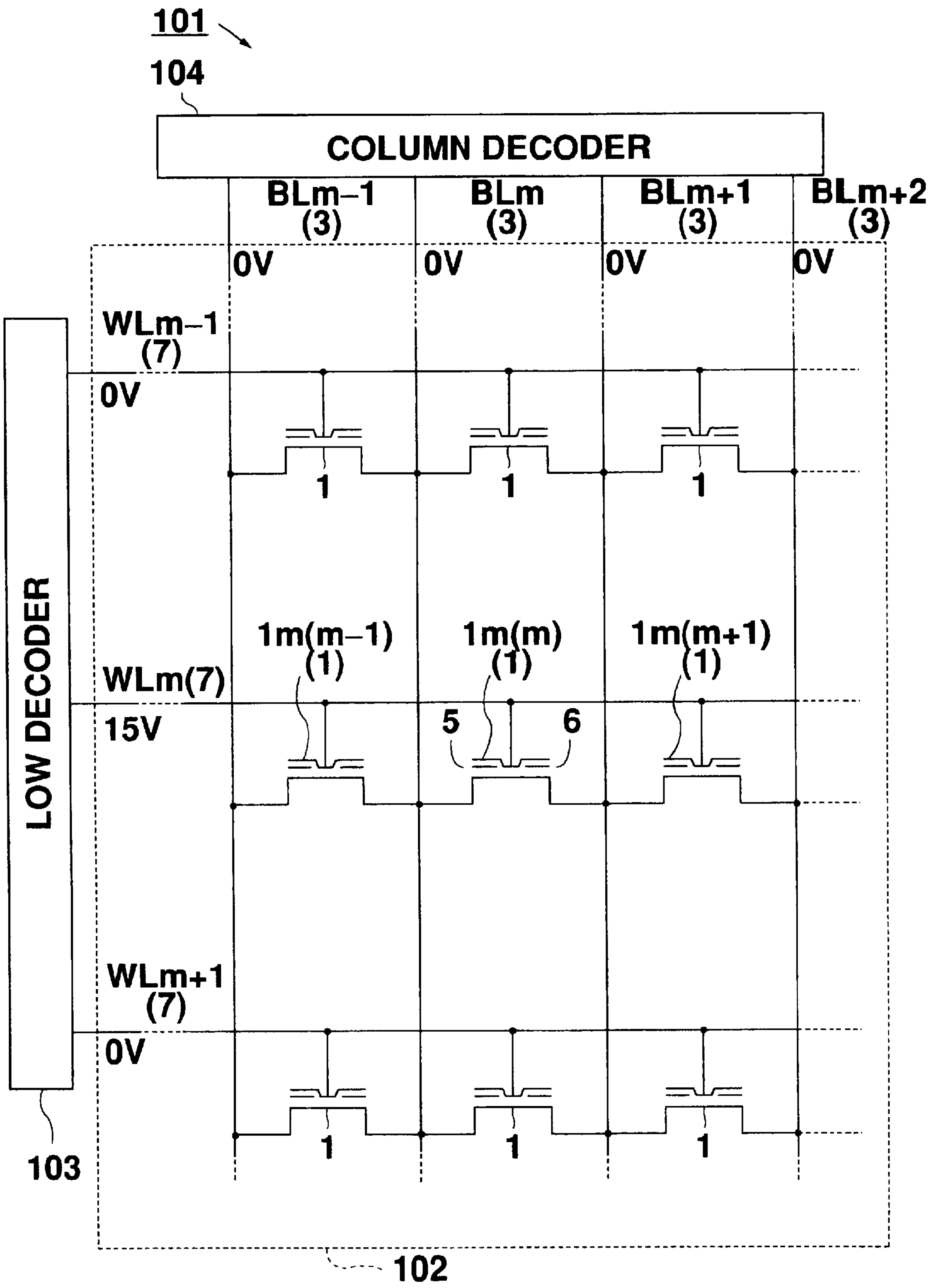
FIG. 8 is a diagram showing an outline of a memory array in the erasing mode comprising the transistors in accordance with the present invention.

Each operation mode (writing, reading, and erasing) of the flash EEPROM 101 will be described referring to FIGS. 3–8. FIGS. 3, 5, and 7 show main parts of FIG. 1*a*, while FIGS. 4, 6, and 8 show main parts of FIG. 2.

Figure 4:
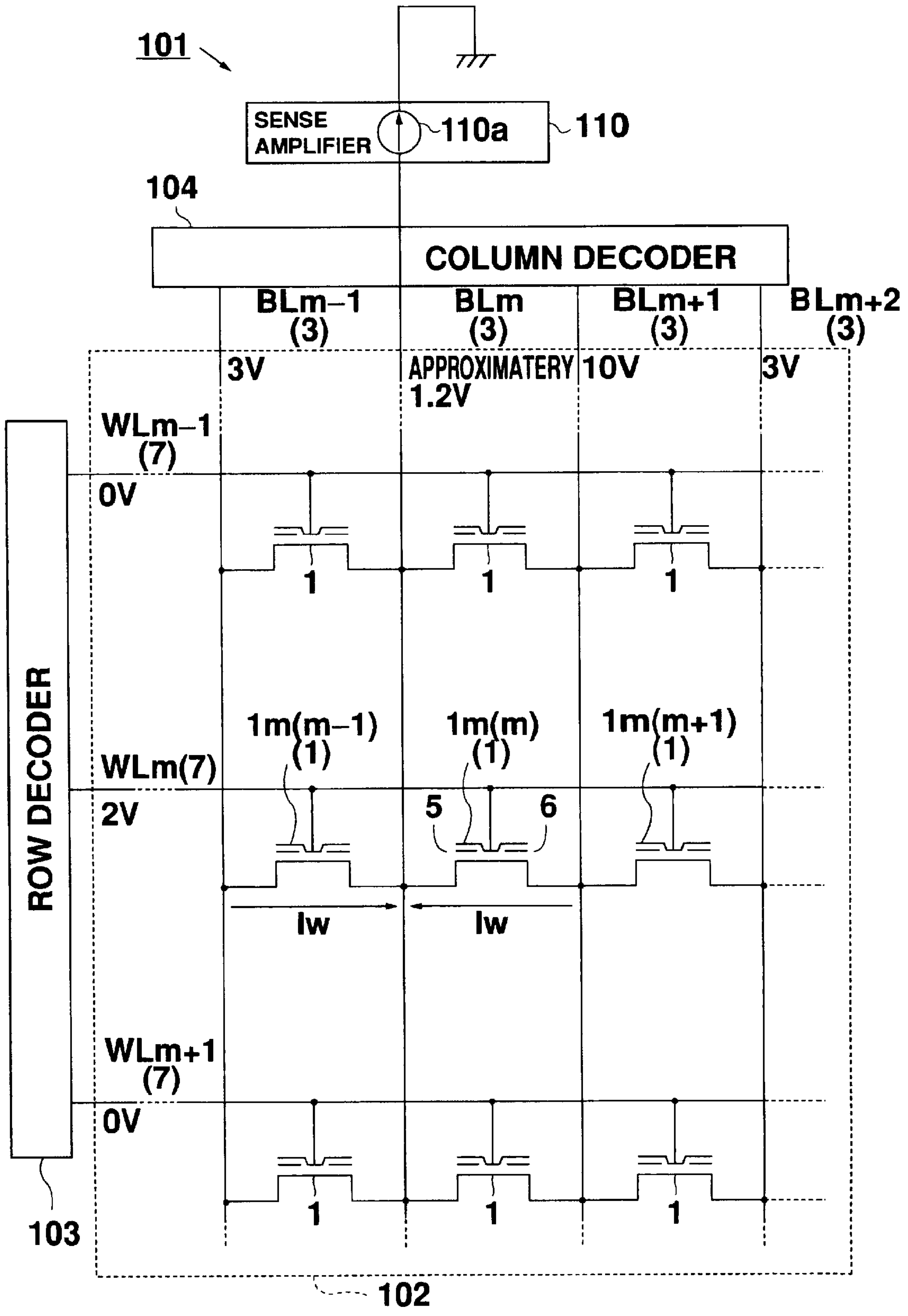
FIG. 4 is a diagram showing an outline of a memory array in the writing mode comprising the transistors in accordance with the present invention.

(a) Writing Operation (See FIGS. 3 and 4)

A case where the memory cell 1 connected to the intersections of word line WLm and bit lines BLm and BLm+1 (hereafter called "1m(m)") is selected and, among the floating gate electrodes of the memory cell 1m(m) 5 and 6, data is written on the floating gate electrode 6, as will be explained below.

The bit line BLm corresponding to the source-drain region 3 closer to the floating gate electrode 5 [hereafter called 3(*a*)] than the other source-drain region 3 in the memory cell 1m(m) is grounded via a constant current source 110*a* set within the sense amplifier 110. The voltage of said bit line is set to 1.2 V.

The potential of the bit line BLm+1 corresponding to the source-drain region 3 closer to the floating gate electrode 6 [hereafter called 3(*b*)] than the other source-drain region 3 in the memory cell 1m(m) is set to 10 V.

The potentials of the bit lines (BL1 . . . BLm−1, BLm+2 . . . BLn) corresponding to the source-drain regions 3 of the memory cells 1 except for the selected memory cell 1m(m) are set to 3 V.

The potential of the word line WLm corresponding to the control gate electrode 7 of the memory cell 1m(m) is set to 2 V. The potentials of the word lines corresponding to the control gates 7 of the memory cells 1 except for the selected memory cell 1m(m) are set to 0 V.

In the memory cell 1m(m), a threshold voltage Vth of the selecting transistor 12 is approximately 0.5 V. Therefore, in the memory cell 1m(m), electrons in the source-drain region 3*a* move to the channel region 4 thereof in the inversion state. As a result, a cell current Iw flows from the source-drain region 3*b* to the source-drain region 3*a*. Since the potential of the source-drain region 3*b* is 10 v, the potential of the floating gate electrode 6 is raised closer to 10 V due to a coupling via the capacity between the source-drain region 3*b* and the floating gate electrode 6. Therefore, a high potential field is created between the channel region 4 and the floating gate electrode 6. As a result, electrons in the channel region 4 are accelerated to become hot electrons, 10 and are injected in the floating gate electrode 6 as shown by the arrow C in FIG. 3. As a consequence, electric charge is stored in the floating gate electrode 6 in the memory cell 1m(m), and 1 bit data is written and stored therein.

Due to the coupling via the capacity between the source-drain region 3 and the floating gate electrode 5, the potential of the floating gate electrode is raised and becomes closer to 1.2 V. However, not electrons will never be injected by a potential so low as this. In other words, in the memory cell 1m(m), hot electrons are injected only in the floating gate electrode 6.

The cell current Iw also flows between the source-drain regions 3 of the memory cell 1 connected to the intersections of the word line WLm and the bit lines BLm−1 and BLm [thereafter called 1 m(m−1)]. However, in the memory cell 1m(m−1), since the potential of the source-drain region 3 corresponding to the bit line Bm−1 is 3V, the potentials of the floating gate electrodes 5 and 6 will never be raised. Therefore, hot electrons will never be injected in the floating gate electrodes 5 and 6 of the memory cell 1m(m−1) and no data will be written on the memory cell 1m(m−1).

In the memory cell 1 connected to the intersections of the word line WLm and the bit lines BLm+1 and BLm+2 [hereafter called 1m(m+1)], the potential of the source-drain region 3 corresponds to the bit line BLm+2 is 3 V, which is higher than the potential (2 V) of the control gate electrode 7 (word line WLm). Therefore, no cell current flows between the source-drain regions 3 thereof. As a result, no hot electrons will be injected in the floating gate electrodes 5 and 6 of the memory cell 1m(m+1), and no data will be written thereon.

For the same reason as described for the case of the memory cell 1m(m+1), no data will be written on the memory cells connected to the word line WLm except for the memory cells 1m(m), 1m(m−1), and 1m(m+1)

Therefore, the writing operation as described above is carried out only on the floating gate electrode 6 of the selected memory cell 1m(m).

By optimizing the value of the cell current Iw which flows between the source-drain regions 3*a* and 3*b* and a duration of the writing operation (the injection duration of the hot electrons in the floating gate electrode 6), the electric charge stored in the floating gate electrode 6 of the memory cell 1m(m) is optimized.

The electric charge stored in the floating gate electrode 6 of the memory cell 1m(m) is set less than the electric charge to be stored in the floating gate electrode 206 of the conventional memory cell 201 so that no overwriting state will be created. In the writing operation, the potential of the source region 203 of the conventional memory cell 102 is set to 12 V, while the potential of the source-drain region 3*b* (the bit line BLm+1) in the memory cell 1m(m) of the present embodiment is set to 10 V to prevent the overwriting state from occurring.

Data may already have been written on the floating gate electrode 5 of the memory cell 1m(m) when data is written on the floating gate electrode 6. In such a case, if a large amount of electric charge has already been stored in the floating gate electrode 5 to create the overwriting state, the channel region under the floating gate electrode 5 completely becomes OFF so that no cell current Iw flows between the source-drain regions 3*a* and 3*b*. Therefore, when data is written on the floating gate electrode 5, in the same manner as the case of the floating gate electrode 6, the electric charge to be stored in the floating gate electrode 5 is set small so that no overwriting state is created. In this manner, even when data is written on the floating gate electrode 5, the channel region under the floating gate electrode 5 will never become completely OFF, and the cell current Iw flows between the source-drain regions 3*a* and 3*b*.

In other words, the electric charge to be stored in the floating gate electrode 6 is set beforehand so that the cell current Iw necessary for data to be written on the floating gate electrode 5 flows. That is, the electric charge to be stored in the floating gate electrode 6 is set small beforehand so that the cell current Iw necessary for data to be written on the floating gate electrode 5 flows.

When data is written on the floating gate electrode 5 of the memory cell 1m(m), the bit line BLm+1 corresponding to the source-drain region 3*b* is grounded via the constant current source 110*a* and the potential of the bit line BLm corresponding to the source-drain region 3*a* is set to 10 V. Other potential conditions are the same as in the case where data is written on the floating gate electrode 6 of the memory cell 1m(m).

Therefore, this writing operation can be performed on each floating gate electrode 5 or 6 of the selected memory cell 1.

(b) Reading Operation (See FIGS. 5 and 6)

A case where the memory cell 1m(m) is selected and, among the floating gate electrodes 5 and 6 thereof, and data is read from the floating gate electrode 6 will be explained below.

The potential of the bit line BLm corresponding to the source-drain region 3*a* of the memory cell 1m(m) is set to 3 V.

The potential of the bit line BLm+1 corresponding to the source-drain region 3*b* of the memory cell 1m(m) is set to 0 V.

The other bit lines (BL1 . . . BLm−1, BLm+2 . . . BLn) corresponding to the source-drain regions 3 of memory cells 1 except for the selected memory cell 1m(m) are set to an open state.

The potential of the word line WLm corresponding to the control gate electrode 7 of the memory cell 1m(m) is set to 4 V.

The potentials of the other word lines WL1 . . . WLm+1, WLm+2 . . . WLn) corresponding to the control gate electrodes 7 of memory cells 1 except for the selected memory cell 1m(m) are set to 0 V.

In the memory cell 1m(m), if the potential of the source-drain region 3*a* is set to 3 V, the potential of the floating gate electrode 5 is raised and becomes closer to 3 V due to coupling via the capacity between the source-drain region 3*a* and the floating gate electrode 5. As a result, the channel region under the floating gate electrode 5 becomes an ON state regardless of the electric charge stored in the floating gate electrode 5.

As will be described later, no electric charge is stored in the floating gate electrode 6 in an erasing mode. On the other hand, electric charge is stored in the floating gate electrode 6 in the writing mode. Therefore, the channel region 4 under the floating gate electrode 6 in the erasing mode is in an ON state, while the channel region 4 under the floating gate electrode 6 in the writing mode is close to an OFF state.

Therefore, when a 4 V voltage is applied to the control gate electrode 7, a cell current Ir which flows from the source-drain region 3*a* to the source-drain region 3*b* becomes larger in the case of the floating gate electrode 6 in the erasing mode than in the writing mode.

By detecting the value of the cell current Ir using the sense amplifier 110, the data stored in the floating gate electrode 6 of the memory cell 1m(m) can be read. For example, reading is performed by letting the data value "1" if the floating gate electrode 6 is in the erasing mode, while "0" if the floating gate electrode 6 is in the writing mode. In this case, the cell current Ir may be detected by connecting the sense amplifier 110 to the source-drain region 3*b*.

If data is read from the floating gate electrode 5 of the memory cell 1m(m), the potential of the bit line BLm+1 corresponding to the source-drain region 3*b* is set to 3 V, while the potential of the bit line BLm corresponding to the source-drain region 3*a* is set to 0 V. The potentials or the open state of the others are the same as the case where data is read from the floating gate electrode 6 of the memory cell 1m(m).

In other words, two data values (=1 bit), i.e., "1" for the erasing mode and "0" for the writing mode, can be stored in either of the floating gate electrodes 5 or 6 of the selected memory cell 1m(m), and the data can be read therefrom.

(c) Erasing Operation (See FIGS. 7 and 8)

A case where the data stored in the floating gate electrodes 5 and 6 of all memory cell 1 connected to the word line WLm is erased will be explained hereinbelow.

The potentials of all bit lines BL1–BLn are set to 0 V.

The potential of the word line WLm is set to 15 V. The potentials of the other word lines (WL1 . . . WLm+1, WLm−2 . . . WLn) except for the word line WLm are set to 0 V.

The capacities between each of the source-drain regions 3*a*, 3*b* the substrate 2, and each of the floating gate electrodes 5 and 6 is much larger than the capacity between the control gate electrode 7 and the floating gate electrodes 5 and 6. In other words, the floating gate electrodes 5 and 6 are strongly coupled with the source-drain regions 3*a* and 3*b* and with the substrate 2. Therefore, if the potentials of control gate electrode 7 and the source-drain region 3*a* or 3*b* become 15 V and 0 V respectively, the potential of the floating gate electrodes 5 and 6 does not change greatly from 0 V. Therefore, potential difference between the control gate electrode 7 and the floating gate electrodes 5 and 6 becomes large and creates a high potential field.

A FN tunnel current flows as a result and, as shown by an arrow D in FIG. 7, electrons in the floating gate electrodes 5 or 6 are pulled toward the control gate electrode 7 and the data stored in each memory cell 1 is erased.

Since the floating gate electrodes 5 and 6 have protuberances 5*a* and 6*a*, the electrons stored in the floating gate electrodes 5 and 6 jump out from the protuberances 5*a* and 6*a* and move toward the control gate electrode 7 when the data is erased. Therefore, electron movement becomes free and the electrons stored in the floating gate electrodes 5 and 6 are efficiently pulled out.

By simultaneously selecting a plurality of word lines WL1–WLn, erasing operation can be performed on all memory cells 1 connected to the selected word line. The erasing operation, as described above, by dividing memory cell array 102 into a plurality of blocks defined by a plurality of word lines WL1–WLn and erasing data by the blocks, is called block erasing.

A method for producing memory cell array 102 will sequentially be explained below referring to FIGS. 9–12. In FIGS. 9–12, a~h are respectively the cross sections of a-1~h-1 cut by the line Y—Y.

Figures 1, 9A:
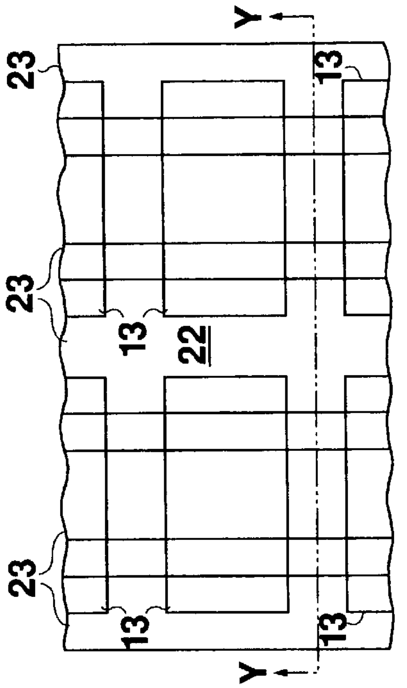

Step 1 [See FIG. 9*a* and FIG. 9*a*-1]: Using the LOCUS method, a field insulating layer 13 is formed on the substrate 2. A gate insulating layer 8 of silicon oxide is formed by the thermal oxidation method on the portions of the substrate 2 where no field insulating layer is formed (element regions) thereon. On the gate insulating layer 8, a doped polysilicon layer 21 which will become the floating gate electrode 5 and 6 is formed. Using the LPCVD method, a silicon nitride layer 22 is formed on the doped polysilicon layer 21. After photoresist coating on the entire surface of the silicon nitride layer 22, using an ordinary photo lithography technique, an etching mask 23 is formed thereon to form both side walls of the floating gate electrodes 5 and 6 which are parallel to the source-drain region 3.

Figures 1, 9B:
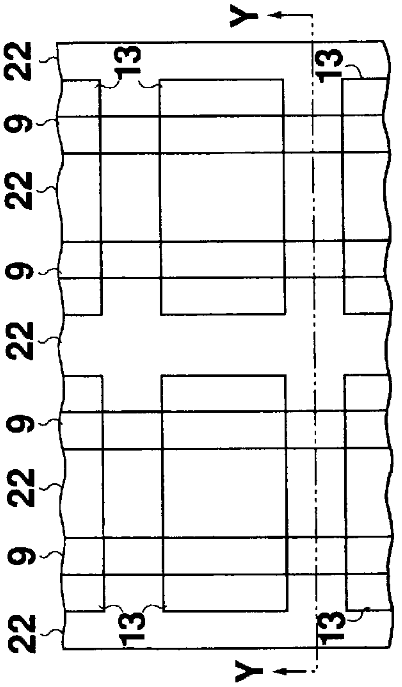
Figure 9A:
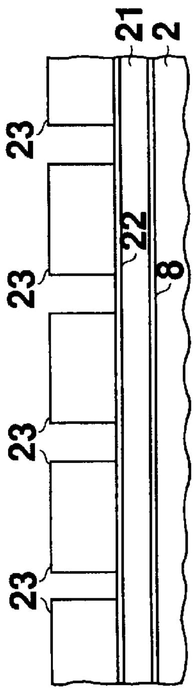
FIGS. 9*a* and 9*b* show cross sections of the memory array related to a first embodiment cut by the line Y—Y in FIGS. 9*a*-1 and 9*b*-1.
Figure 9B:
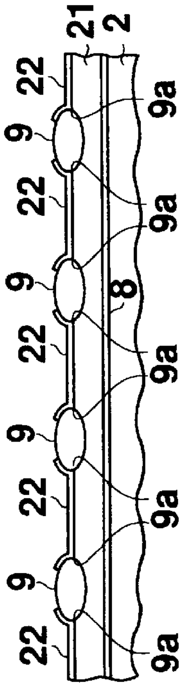

Step 2 [See FIG. 9*b* and FIG. 9*b*-1]: Silicon nitride layer 23 is etched by anisotropy etching using the etching mask 23. The etching mask 23 is then removed. Using the LOCOS method, an insulating layer 9 is formed by oxidation of the doped polysilicon layer 21 with the etched silicon nitride layer serving as a mask for oxidation. At this time, bird's beaks 9*a* are formed by intrusion of the edges of the insulating layer 9 into the edges of the silicon nitride layer 22.

Figures 1, 10C:
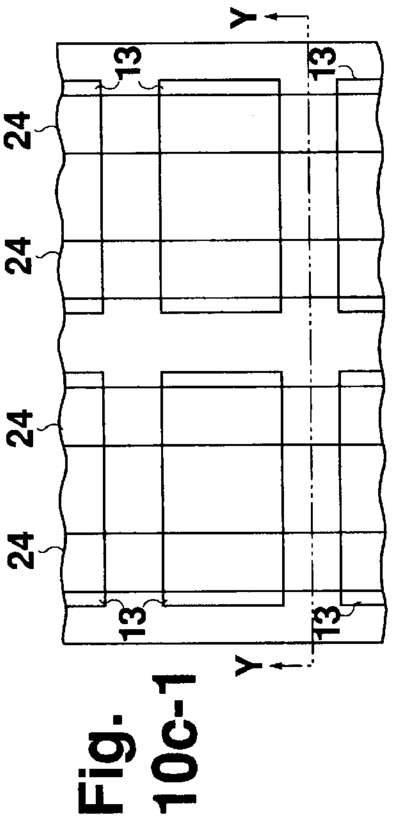

Step 3 [See FIG. 10*c* and FIG. 10*c*-1]: The silicon nitride layer 22 is removed. A layer 24 which will become the floating gate electrodes 5 and 6 is formed by etching of the doped polysilicon layer 21 using the anisotropy etching with the insulating layer 9 serving as an etching mask. The layer 24 has a shape of consecutive floating gate electrodes 5 laid out in parallel with the source-drain regions 3, and a shape of consecutive floating gate electrodes 6 laid out in parallel with the source-drain regions 3. Both side walls of the layer 24 will therefore become the side walls of the floating gate electrodes 5 and 6. Since the insulating layer 9 has bird's beaks 9*a* at its edges, the upper edges of the layer 24 becomes sharp due to the shape of the bird's beaks 9*a*, and form protuberances 5*a* and 6*a*.

Figures 1, 10D:
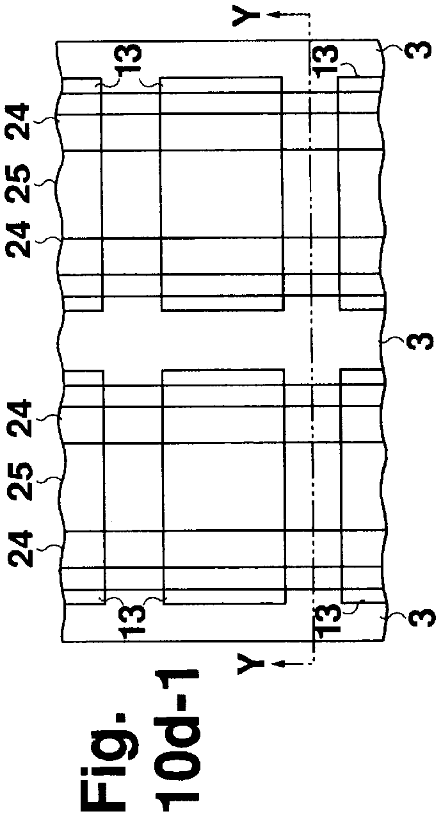
Figure 10C:
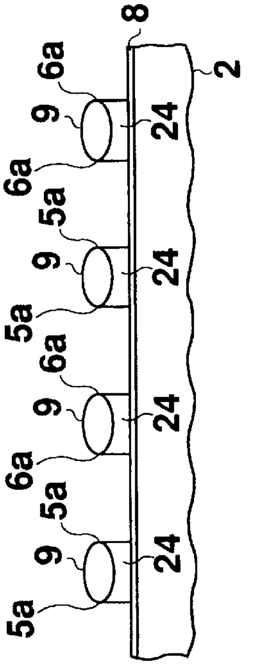
FIGS. 10*c* and 10*d* show the cross sections of the present invention cut by the line Y—Y in FIGS. 10*c*-1 and 10*d*-1.
Figure 10D:
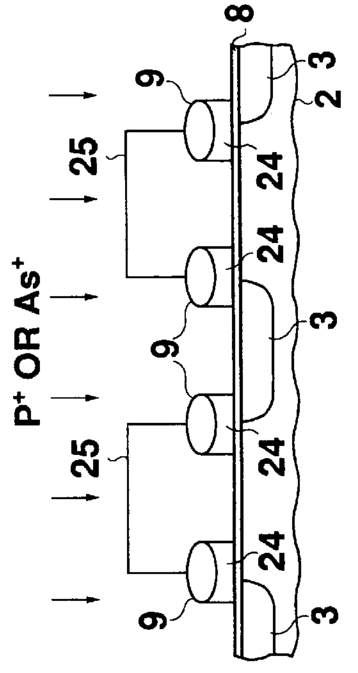

Step 4 [See FIGS. 10*d* and *d*-1]: After the photoresist coating on the entire surface of the device is formed through the steps as described above, a mask for ion injection 25 is formed using an ordinary photo lithography technique to form the source-drain regions 3. The source-drain regions 3 are formed by injection of an N type impurity ion (phosphorous ion or arsenic ion, or the like) on the surface of the substrate 2 using an ordinary ion infection method. The mask for ion injection 25 is then removed.

The mask for ion injection 25 should be formed so as to cover the portions of the substrate 2 where no source-drain region is formed and also not to protrude beyond the layer 24. As a result, positions of the source-drain regions 3 are defined by the side walls of the layer 24 (that is, the edge portions of the floating gate electrodes 5 and 6)

Figures 1, 11E:
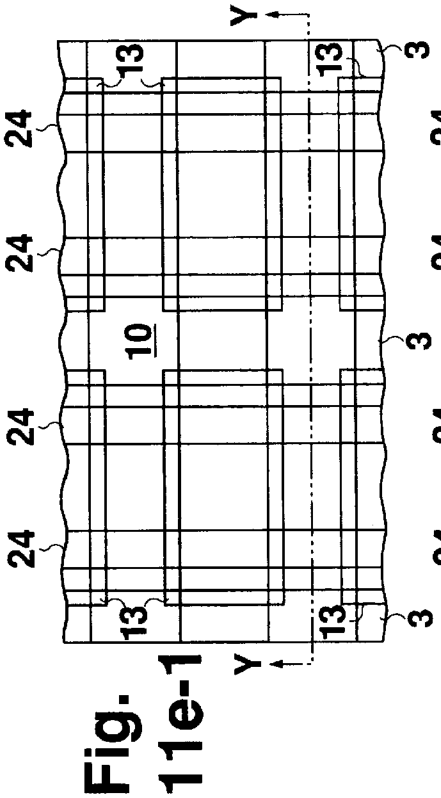

Step 5 [See FIGS. 11*e* and *e*-1: By a thermal oxidation or LPCVD method, or a combination of these methods, an insulating layer 10 of silicon oxide is formed on the entire surface of the device formed through the steps as described above. The stacked insulating layers 8 and 10, and the insulating layers 9 and 10 are unified.

Figures 1, 11F:
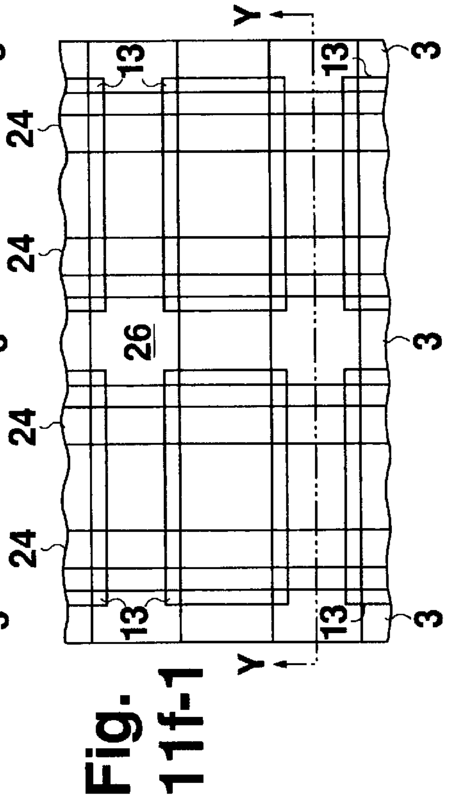
Figure 11E:
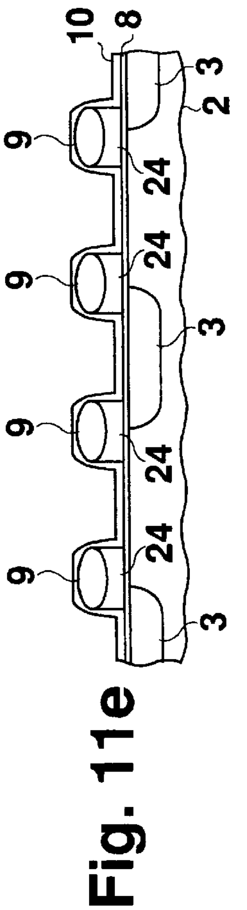
FIGS. 11*e* and 11*f* show the cross sections of the present invention cut by the line Y—Y in FIGS. 11*e*-1 and 11*f*-1.
Figure 11F:
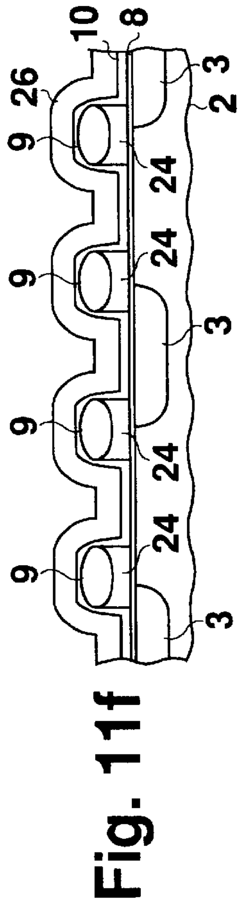

Step 6 [See FIGS. 11*f* and 11*f*-1]: A doped polysilicon layer 26 which will become the control gate electrode 7 is formed on the entire surface of the device formed through the above steps.

The following methods are methods of forming the doped polysilicon layers 21 and 26.

Method 1: A gas including impurities is mixed with a material gas when a doped polysilicon layer is formed using the LPCVD method.

Method 2: After a polysilicon layer without doping is formed sing the LPCVD method, an impurity diffusion source layer ($POCI_3$ or the like) is formed thereon and let the impurities diffuse on the polysilicon layer from said impurity diffusion source layer.

Method 3: After a polysilicon layer without doping is formed using the LPCVD method, impurity ions are injected therein.

Figures 1, 12G:
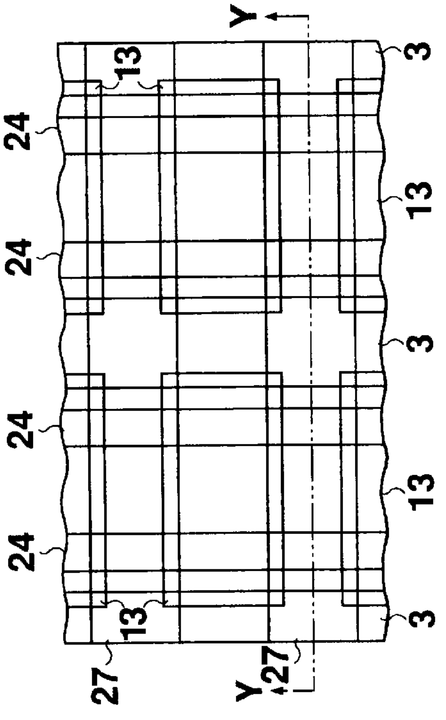

Step 6 [See FIGS. 12*g* and 12*g*-1]: After the photoresist coating on the entire surface of the device is formed through the steps described above, using the ordinary photo lithography technique, a mask for ion injection 27 is formed to form the floating gate electrodes 5 and 6, and the control gate electrode 7.

Figures 1, 12H:
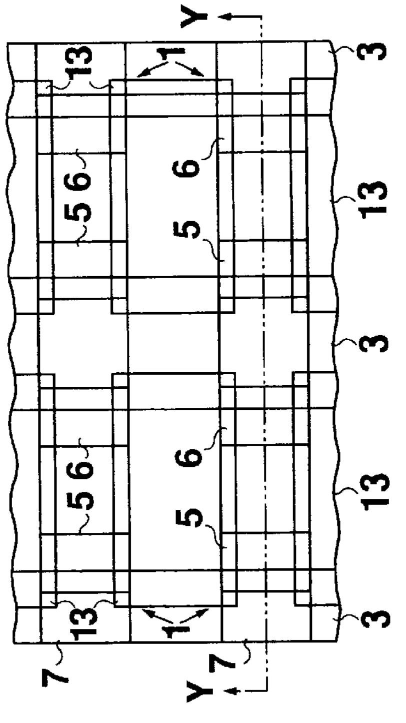
Figure 12G:
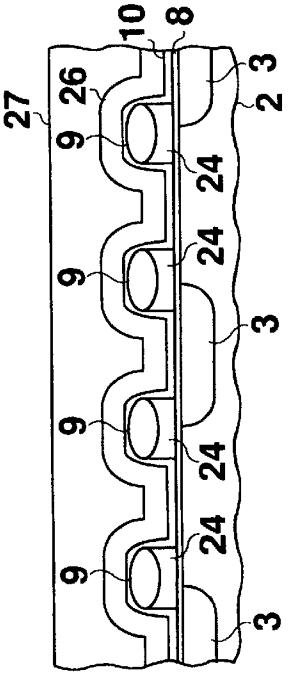
FIGS. 12*g* and 12*h* show the cross sections of the present invention cut by the line Y—Y in FIGS. 12*g*-1 and 12*h*-1.
Figure 12H:
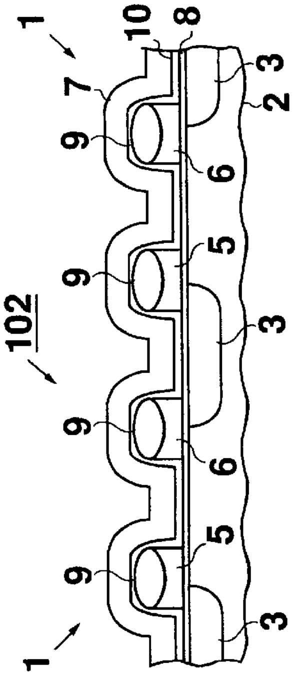

Step 7 [See FIGS. 12*h* and 12*h*-1]: The doped polysilicon layer 26, the insulating layer 10, the insulating layer 9, and the layer 24 are etched simultaneously by the anisotropy etching using the etching mask 27. By this step, the control gate electrode 7 is formed from the doped polysilicon layer 26, and the floating gate electrodes 5 and 6 are formed by the layer 24.

After the etching mask 27 is removed, the memory cell array 102 is complete.

As described in the above, the following functions and effects can be obtained.

[1] The memory cell 1 has two floating gate electrodes 5 and 6. The floating gate electrodes 5 and 6 are placed next to each other on the channel region 4 between the two source-drain regions 3. The floating gate electrodes 5 and 6 share one control gate electrode 7. Each memory cell 1 can store 1 data bit in each floating gate electrode 5 or 6, that is, 2 data bits altogether.

Therefore, in the same design rule, the memory cell 1 can reduce the occupied area per bit on the substrate 2 to 66% of the occupied area of the conventional memory cell 201. In other words, the memory cell 1 enables high integration comparable to a stacked gate type memory cell.

[2] By the control gate electrodes 7 of the memory cell 1 laid out in columns, common word lines are formed. In other words, the control gate electrodes 7 of the memory cell laid out in columns are consecutive, not separate.

Therefore, the aforementioned problem (1) of the prior art is completely avoidable.

[3] Due to [2] described above, it is not necessary to consider the alignment accuracy of the floating gate electrodes 5 and 6, and the control gate electrode 7. Therefore, the aforementioned problem (2) of the prior art is completely avoidable.

[4] In Step 7 of the present embodiment, the control gate electrode 7 is formed from the doped polysilicon layer 26 and the floating gate electrodes 5 and 6 are formed from the layer 24 by simultaneously etching the doped polysilicon layer 26, the insulating layer 20, the insulating layer 9, and the layer 24 with an etching gas being controlled.

[5] In the memory cell array 102, the source-drain regions 3 of the memory cells 1 laid out in rows form the common bit lines BL1–BLn. Therefore, in the memory cell array 102, bit contact, lines such as the bit contact line 214 in the conventional memory cell array 302 are not necessary.

[6] Because of [4] and [5] in the above, the memory cell array of the present embodiment has simpler configuration and easier manufacturing steps than the conventional memory cell array 302 has.

The flash EEPROM 101 using the memory cells 1 has the selecting transistor 12. Therefore, each memory cell 1 has a function to select itself. In other words, even when too great electric charge is pulled out from the floating gate electrodes 5 and 6 in the erasing operation, the selecting transistor 12 can switch the channel region 4 to an OFF state. Therefore, if over erasing occurs, the selecting transistor 12 can switch ON-OFF states of the memory cell 1, and over erasing does not cause a problem. In other words, the selecting transistor 12 within the memory cell 1 can select an ON or OFF state of the memory cell 1.

[8] To optimize the electric charge stored in the floating gate electrodes 5 and 6 of the memory cell 1 in the writing operation, a technique to store in the memory cell 1 not only the two values (=1 bit) of the writing mode and the erasing node, but also more than 3 values (multi-state memory technique) may be applied. In other words, in the multi-state memory technique, it is necessary and indispensable to precisely control the writing mode by precisely controlling the potentials of the floating gate electrodes in the memory cell. If the technique to control the potentials of the floating gate electrodes is used, it is easy to optimize the electric charge stored in the floating gate electrodes 5 and 6 of the memory cell 1 in the writing operation.

[9] In the writing operation, to prevent the overwriting state, the potential of the source-drain region 3*b* (bit line BLm+1) of the memory cell 1m(m) is set low to 10 V. Therefore, if a source voltage of the flash EEPROM 101 is lowered to 3.3 V, the load on a charge pump becomes lighter and it becomes easier to cope with a lower voltage.

On the other hand, in the conventional memory cell 201, the potential of the source region 203 in the writing operation is set to 12 V. Therefore, if the source voltage of the flash EEPROM 301 is 3.3 V, it is difficult to generate the voltage to be applied to the source region 203 (=12 V) using a charge pump. Therefore, a special circuit to generate said voltage is required, and circuit configuration becomes complex.

[10] The length of the channel region 4 in the memory cell 1 is longer than the channel region 205 in the conventional memory cell 201. Therefore, the breakdown voltage of the channel region 4 becomes higher than the breakdown voltage of the channel region 205. As a result, in the writing operation, data is not easily written on the floating gate electrodes of the memory cells 1 except for the floating gate electrodes of the selected memory cell 1, and the functions and effects of the writing operation described above will be obtained with more certainty.

[11] In the reading operation, when the value of the cell current Ir in the memory cell 1 is detected by the sense amplifier 110, a multi-state memory technique can be used. In other words, in the multi-state memory technique, it is necessary and indispensable to precisely detect a cell current in reading operation. By using the cell current detection technique, the value of the cell current Ir in the memory cell 1 can be precisely detected in the reading operation.

[12] In the writing operation, the electric charge to be stored in the floating gate electrodes 5 and 6 of the memory cell 1 is set small to avoid the overwriting state. As a result, in the erasing operation, the amount of electrons pulled from the floating gate electrodes 5 and 6 toward the control gate electrode 7 also becomes small.

[13] At upper portions of the floating gate electrodes 5 and 6 of the memory cell 1, protuberances 5*a* and 6*a* are formed. In the erasing operation, the electrons in the floating gate electrodes and 6 jump out and move from the aforesaid protuberances to the control gate electrode 7.

On the other hand, in the conventional memory cell 201, the electrons in the floating gate electrode 206 jump out and move from only the protuberance 206*a* to the control gate electrode 207 in the erasing operation.

Therefore, if the electric charges stored in the floating gate electrodes 5, 6, and 206 are the same, the amount of electrons which jump out from one protuberance is smaller in the memory cell 1 than in the memory cell 201.

[14] Because of [12] and [13] described above, the amount of electrons passing through the insulating layer 10 is reduced.

In the known art, a problem occurs that operation life of the memory cell 201 becomes short due to electrons passing through the insulating layer 210 in the erasing operation.

In other words, at an early stage of the above-described step 4 of the prior art where the insulating layer is formed, an impure silicon oxide layer is formed due to a natural oxide layer or a structural transition layer. In this impure silicon oxide layer, not only O—Si—C bonds which form pure silicon oxide, but also dangling bonds which do not form O—Si—O bonds are included.

In other words, during the shift from the above-described step 3 to step 4 in the prior art, side walls of the floating gate electrodes 206 are exposed with air containing oxygen, which leads forming of the natural oxide layer on the surface of the side walls of the floating gate electrode 206. The natural oxide layer includes dangling bonds which do not form O—Si—C bonds.

The structural transition layer exists at the boundary between the floating gate electrode 206 which is composed of polysilicon layer, and the insulating layer 210 which is composed of the silicon oxide layer. Dangling bonds which do not form O—Si—O bonds tend to occur at the structural transition layer.

Figure 22A:
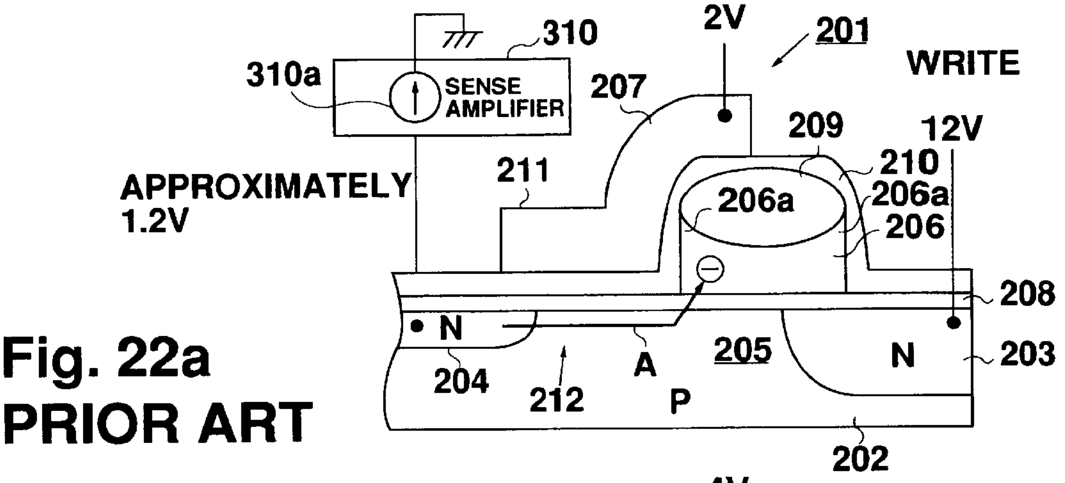
FIG. 22*a* illustrates a cross section of the transistor in a writing mode in the conventional configuration.
Figure 22B:
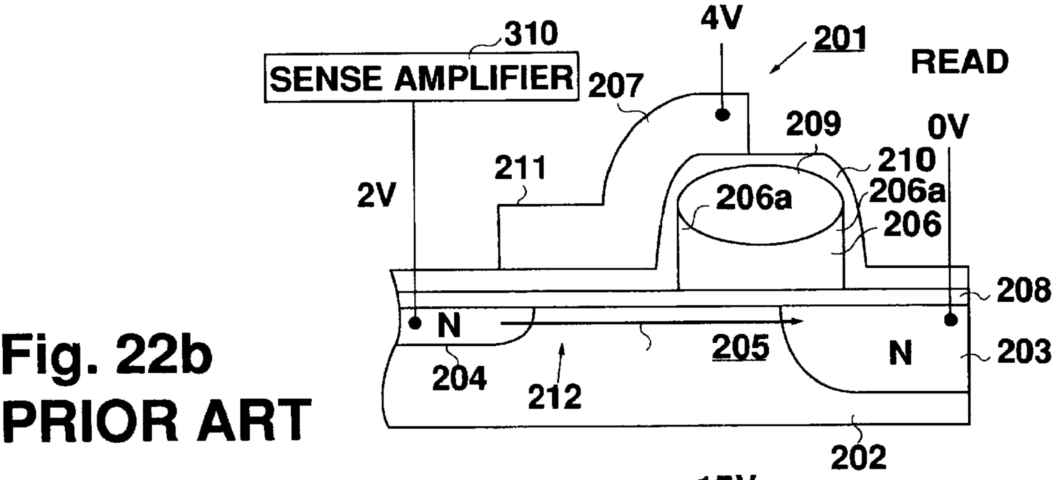
FIG. 22*b* illustrates a cross section of the transistor in a reading mode in the conventional configuration.
Figure 22C:
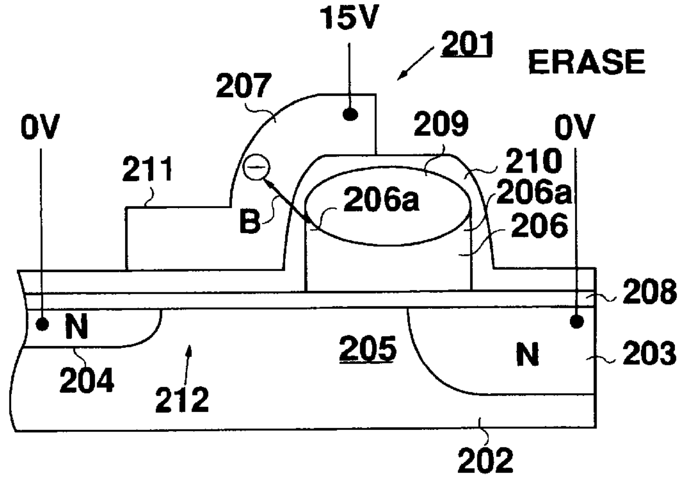
FIG. 22*c* illustrates a cross section of the transistor in an erasing mode in the conventional configuration.
Figures 23A, 23B, 23C, 23D:
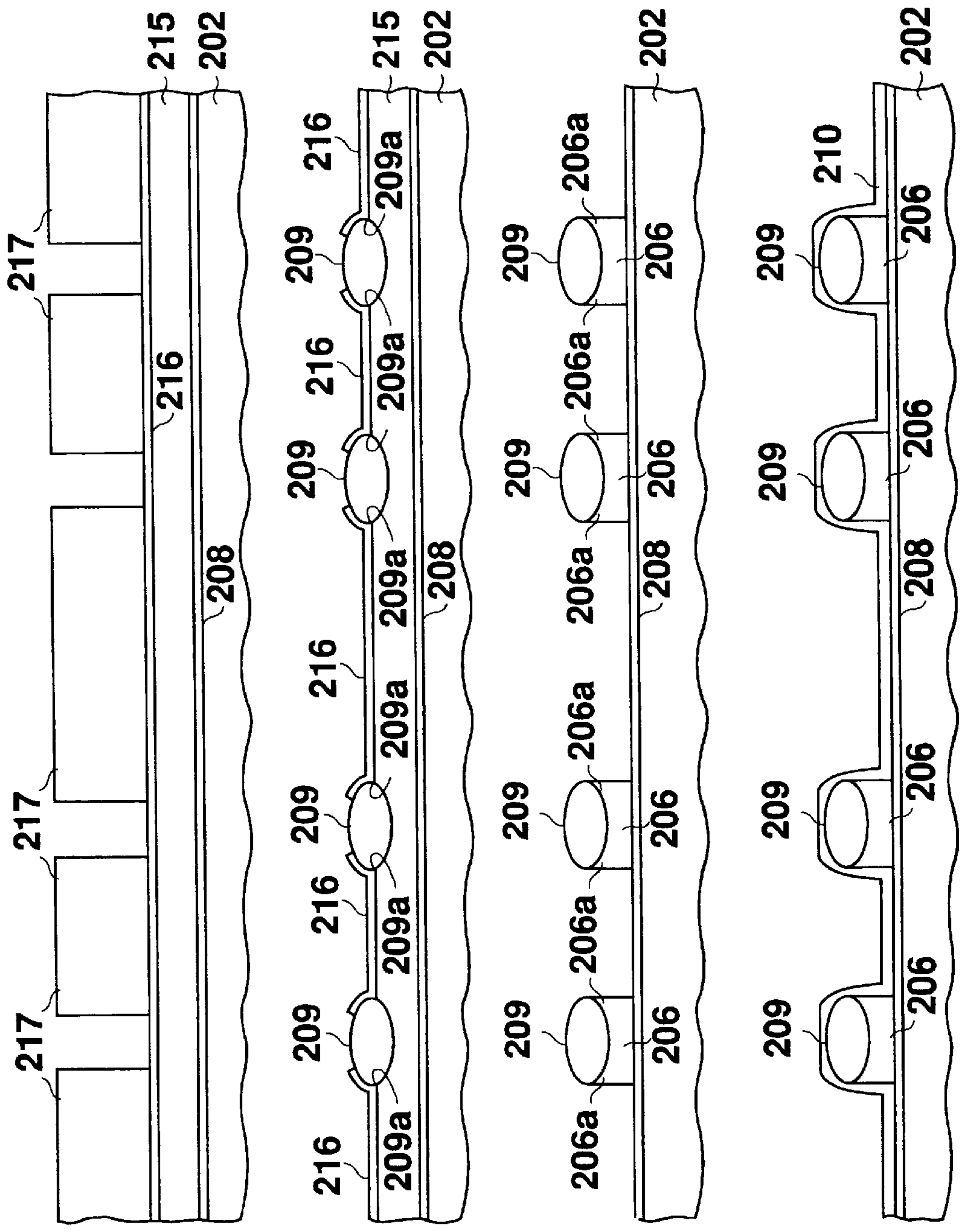
FIGS. 23*a*, 23*b*, 23*c*, 23*d*, 24*e*, 24*f*, 24*g*, 25*h*, 25*i*, 26*a*, and 26*b* are cross sections showing manufacturing processes of a transistor in the conventional configuration.
Figure 24E:
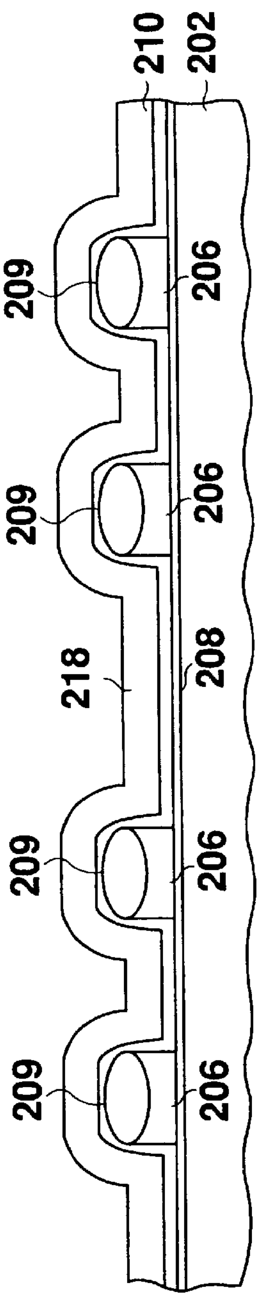
Figure 24F:
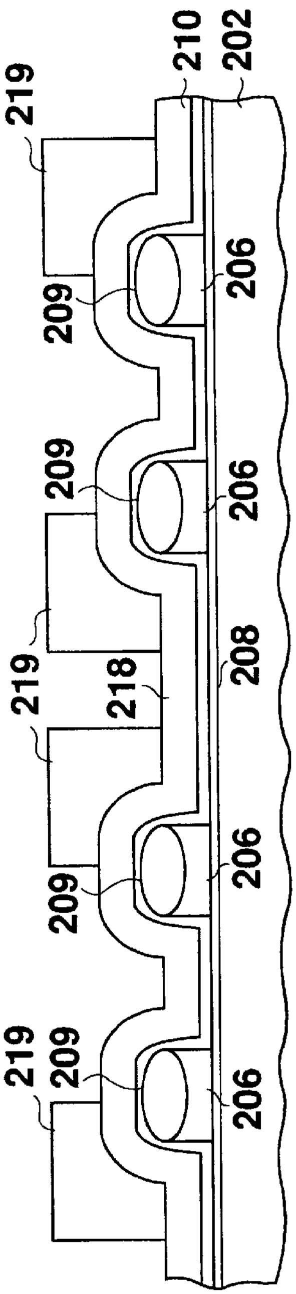
Figure 24G:
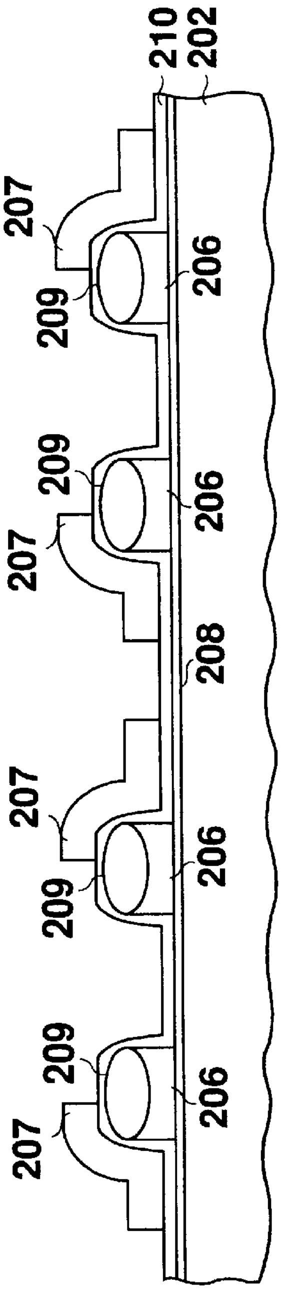
Figure 25H:
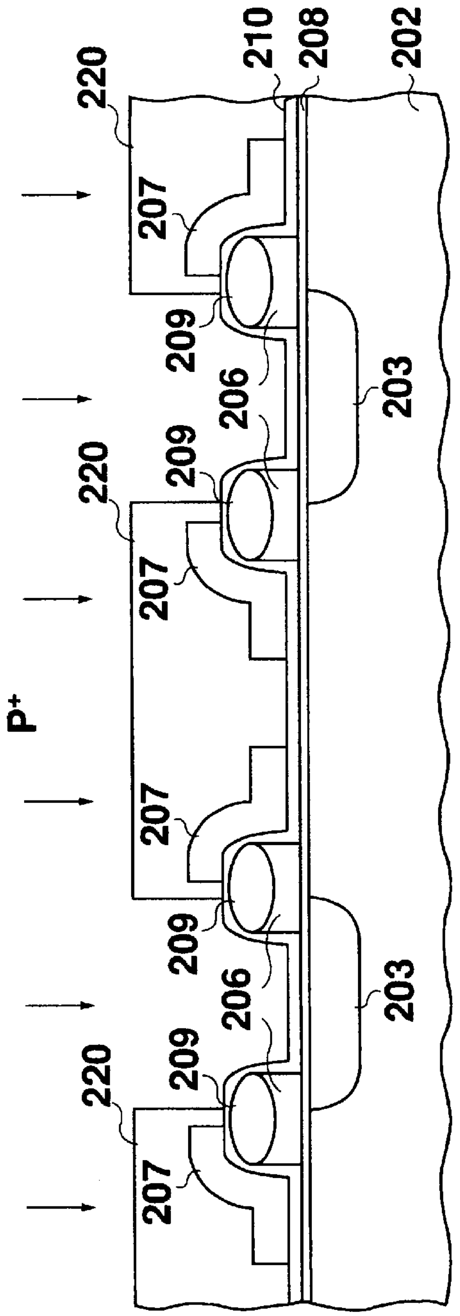
Figure 25I:
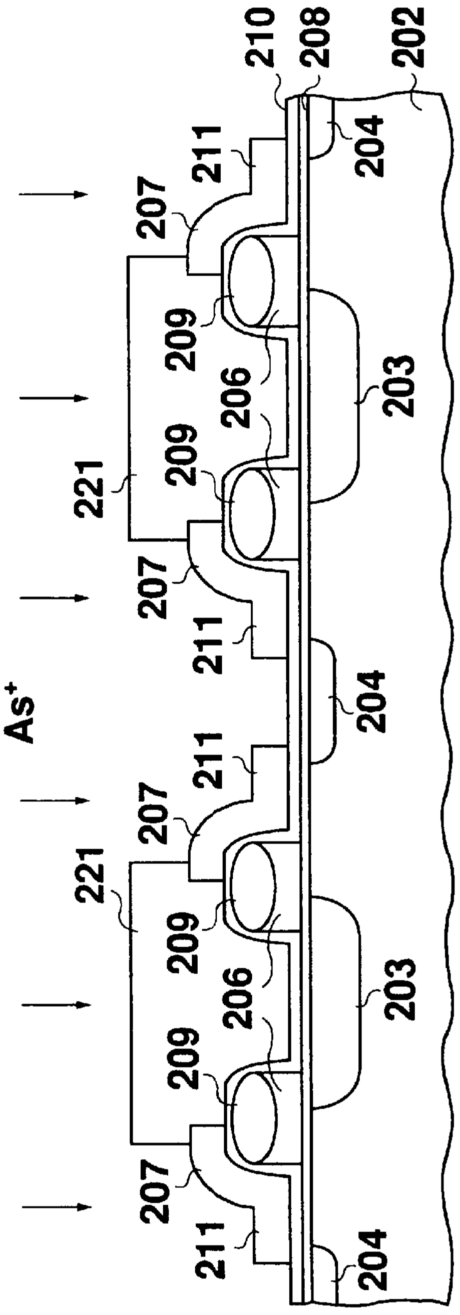
Figure 26A:
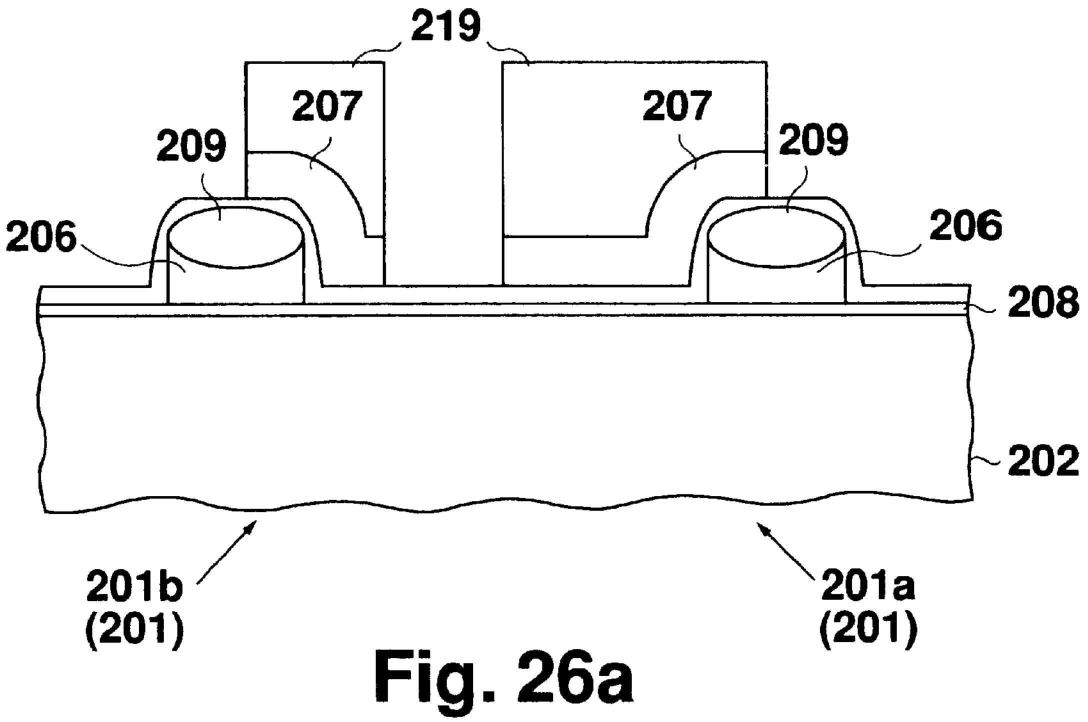
Figure 26B:
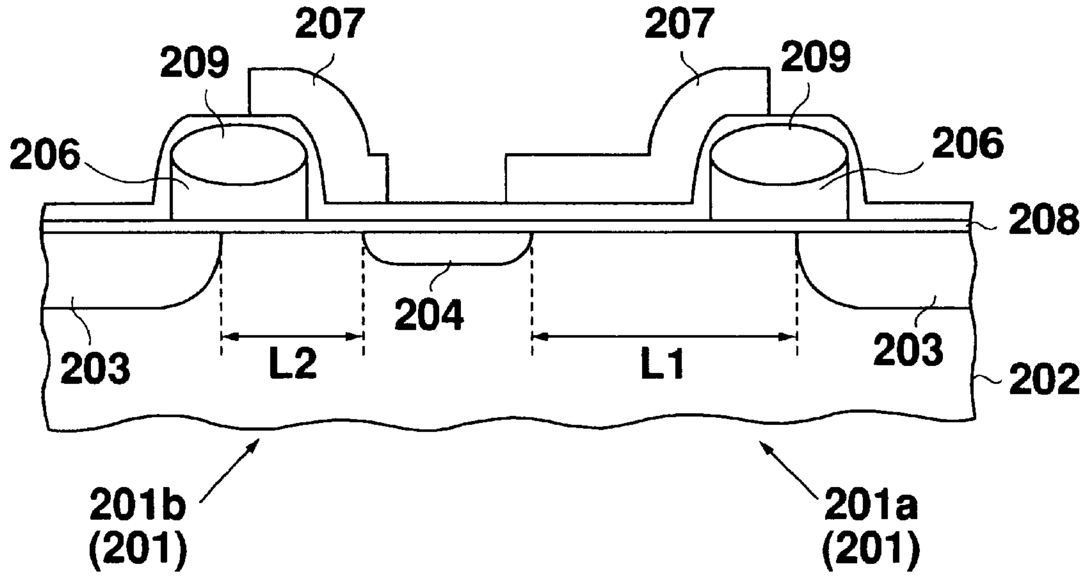

As described above, in the erasing operation, electrons in the floating gate electrode 206 are pulled to the control gate electrode 207 as shown by the arrow B in FIG. 22*c*, and the data stored in the memory cell 201 is erased. At this time, electrons pass through the insulating layer 210 including the impure silicon oxide layer, and a large stress is put on the insulating layer 210.

Therefore, if writing and erasing operations are repeated, electron traps will be created in the layer including the impure silicon oxide layer due to the stress put on the insulating layer 210 in the erasing operation. The electron traps hinder the movement of the electrons from the floating gate electrode 206 to the control gate electrode 207. Therefore, as the number of writing and erasing (that is, the number of data rewriting operations increases, the number of electron traps also increases in the silicon oxide layer including the impure silicon layer, and electrons in the floating gate electrode 206 will not be pulled sufficiently.

As a result, it becomes difficult to increase the number of data rewriting operations in the memory cell 201 and the operation life of the memory cell 201 becomes shorter. When the operation life of the memory cell 201 grows shorter, the operation life of the flash EEPROM also becomes shorter.

On the other hand, in the present invention, it is possible to reduce the amount of the electrons passing through the insulating layer 10, and the number of data rewriting operations in the memory cell 1 can be increased. As a result, it is possible to prolong the operation life of the memory cell 1 and the flash EEPROM 101.

Second Embodiment

Hereinafter, a second embodiment implementing the present invention will be explained referring to the accompanying drawings. In the present embodiment, components corresponding to those in the first embodiment have the same indices and a detailed explanation will not be repeated.

Figure 13:
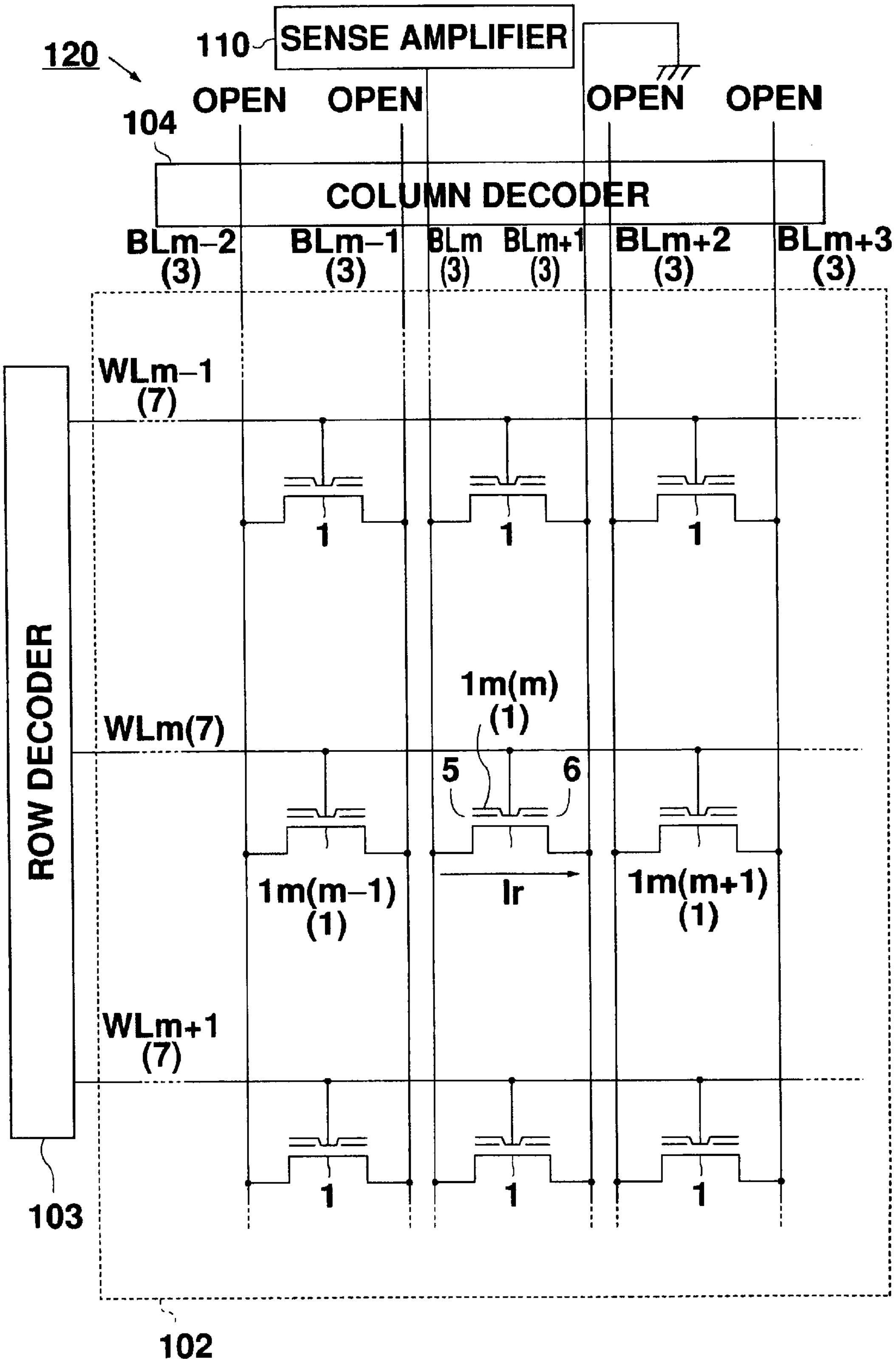
FIG. 13 is a diagram showing an outline of a transistor array.

FIG. 13 shows a configuration of a flash EEPROM 120 related to the present invention.

In the present embodiment, the flash EEPROM 120 is different from the flash EEPROM 101 shown in FIG. 6 in the following points.

{1} In the memory cell array 102, the source-drain regions 3 of the memory cells 1 laid out in rows are divided.

{2} In the memory cell array 102, individual bit lines BL1–BLn are formed by the source-drain regions 3 laid out in rows in memory cells 1 laid out in columns.

In other words, the bit line BLm to which the memory cell 1m(m) is connected is separated from the bit line BLm−1 to which the memory cell 1m(m−1) is connected. The bit line BLm+1 to which the memory cell 1m(m) is connected is also separated from the bit line BLm+2 to which the memory cell 1m(m+1) is connected.

According to the present embodiment configured as described above, the following functions and effects as well as the functions and effects of the first embodiment can be obtained.

In the first embodiment, in the reading operation, even when bit lines (BL1 . . . BLm−1, BLm+2 . . . BLn) corresponding to the source-drain regions 3 of the memory cells except for the selected memory cell 1m(m) are made open state, charge/discharge currents flow through the aforesaid bit lines. As a result, the cell current Ir in the memory cell 1m(m) cannot be precisely detected by the sense amplifier 110 if measured before the charge/discharge of the bit lines has been completed. In other words, due to time necessary for charge/discharge of the bit lines which should be made open state, reading speed may be reduced, although the reduction may be very slight.

On the other hand, in the present embodiment, individual bit lines (BL1–BLn) are formed at each memory cell 1 laid out in columns. Therefore, in the reading operation, even when the bit lines (BL1 . . . BLm−1, BLm+2 . . . BLn) corresponding to the source-drain regions 3 of the memory cell 1 except for the selected memory cell 1m(m) are made open state, no charge/discharge current flows through the aforesaid bit lines. As a consequence, according to the present embodiment, it is possible to prevent reduction in reading speed due to the charge/discharge current of the bit lines BL1–BLn as is the case for the first embodiment. A fast reading operation is thus realized.

In the present embodiment, since individual bit lines (BL1–BLn) are formed at each memory cell 1 laid out in columns, erasing operation at each selected memory cell 1 can be performed.

Third Embodiment

Hereinafter, a third embodiment implementing the present invention will be explained referring to the accompanying drawings. In the present embodiment, the components same as in the second embodiment have the same indices and detail explanation of them will not be provided.

Figure 14:
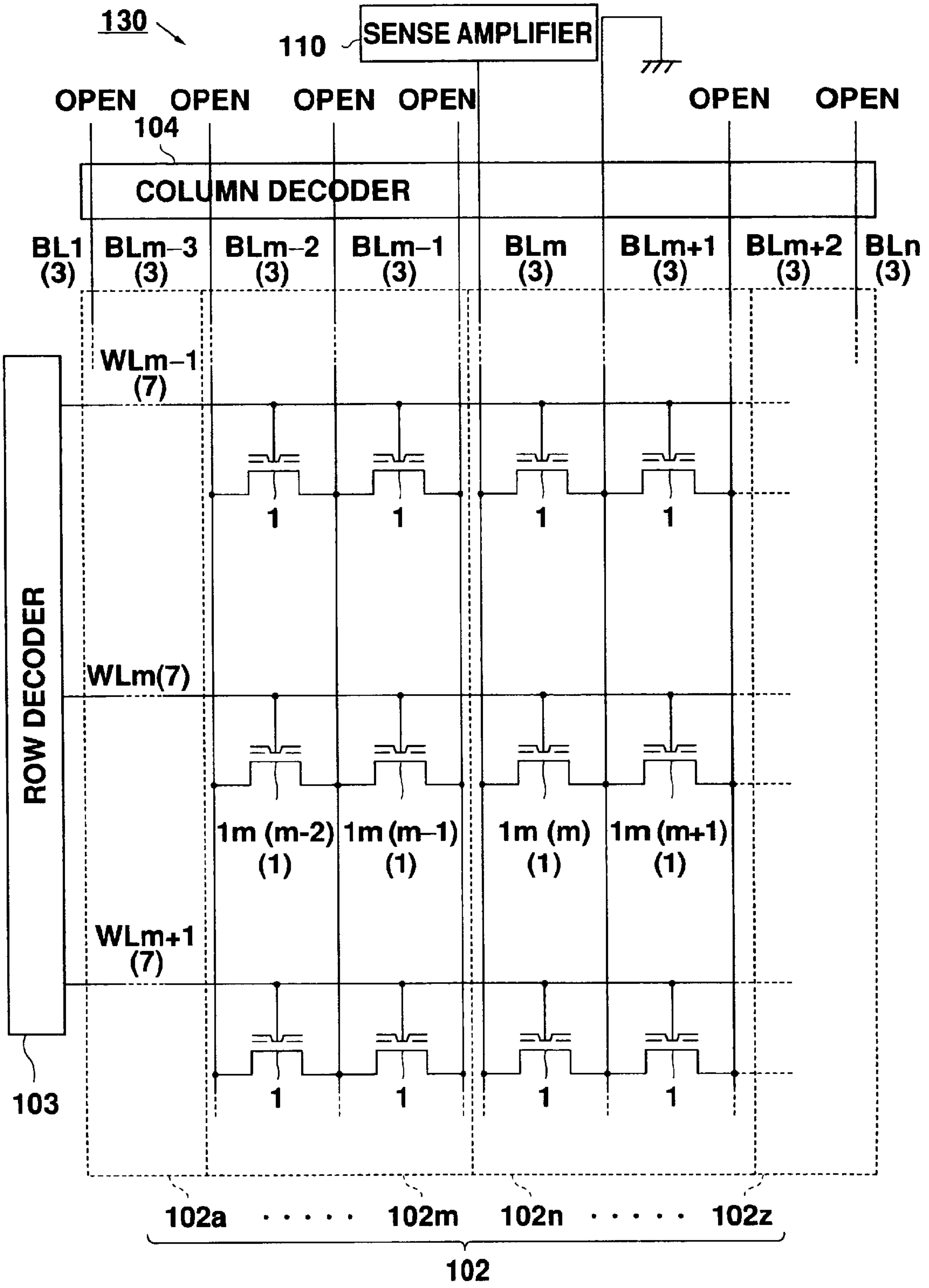
FIG. 14 is a diagram showing an outline of a transistor array.

FIG. 14 shows a configuration of a flash EEPROM 130 related to the present invention.

In the present embodiment, the flash EEPROM 130 is different from the flash EEPROM 120 of the second embodiment in the following points.

{1} The memory cell array 102 corresponds to each bit line BL1–BLn, and is divided in columns of a plurality of cell blocks 102*a*–102*z*. In other words, the cell block 102*m* is composed of the memory cells 1 connected to each bit line BLm−3~BLm−1. The memory cell 102*n* is composed of the memory cells 1 connected to each bit line BLm–BLm+2. In other words, each cell block 102*a*–102*z* has 3 bit lines BL1–BLn.

{2} In each cell block 102*a*–102*z*, common bit lines are formed by the source-drain regions 3 of the memory cells 1 laid out in rows.

{3} In different cell blocks 102*a*–102*z*, the source-drain regions 3 of the memory cell 1 laid out in columns are separated. In neighboring cell blocks 102*a*–102*z*, the source-drain regions 3 of the memory cells 1 laid out in rows are separated and form different bit lines. In other words, in each memory cell blocks 102*m* or 102*n*, the source-drain regions 3 corresponding to the individual bit lines BLm−1 and BLm are separated.

In other words, the memory cells 1m(m) and 1m(m+1) are connected to the common bit line BLm+1, and the memory cells 1m(m−2) and 1m(m−1) are connected to the common bit line BLm−2. The bit line BLm to which the memory cell 1m(m) is connected is separated from the bit line BLm−1 to which the memory cell m(m−1) is connected.

According to the present embodiment configured as described above, the following functions and effects can be obtained in addition to the functions and effects of the first embodiment.

In the second embodiment, the reading speed is increased, but the area of the memory cell array 102 becomes large since the source-drain regions 3 are formed corresponding to the individual bit lines of the memory cells 1 laid out in columns.

On the other hand, in the present embodiment, in the neighboring cell blocks 102*a*–102*z*, the source-drain regions 3 of the memory cells 1 laid out in rows are separated and different bit lines are formed. In other words, in a same cell block 102*a*–102*z*, the source-drain regions 3 corresponding to one common bit line are formed by the source-drain regions 3 of the memory cell 1 laid out in rows in the same manner as described in the first embodiment. Therefore, according to the present embodiment, the occupied area can be reduced greater than in the second embodiment.

In the present embodiment, a charge/discharge current does flow through the bit line BLm+2 connected to the memory cell 1m(m+1) neighboring the selected memory cell 1m(m). However, since no charge/discharge current flows through the other bit lines (BL1 . . . BLm−1, BLm+3 . . . BLn), reading operations faster than the first embodiment can be performed.

In the present embodiment, among the memory cells 1 connected to the selected word line WL1–WLn, erasing operations can be carried out only on all memory cells within the selected cell blocks 102*a*–102*z*. For example, the erasing operation is carried out only on the memory cells 1m(m−2) and 1 m(m−1) within the cell block 102*m*, and no erasing operation can be performed on the other memory cells 1 connected to the same word line WLm. The erasing operation can also be carried out on the memory cells 1 1m(m−2), 1m(m−1), 1m(m) and 1m(m+1) within the cell block 102*m* and 102*n*, and no erasing operation can be performed on the other memory cells 1 connected to the same word line WLm.

Fourth Embodiment

Hereinafter, a fourth embodiment implementing the present invention will be explained referring to the accompanying figures. In the present embodiment, the components corresponding to those already described for the first embodiment are given the same indices and their explanation will not be repeated.

Figure 15:
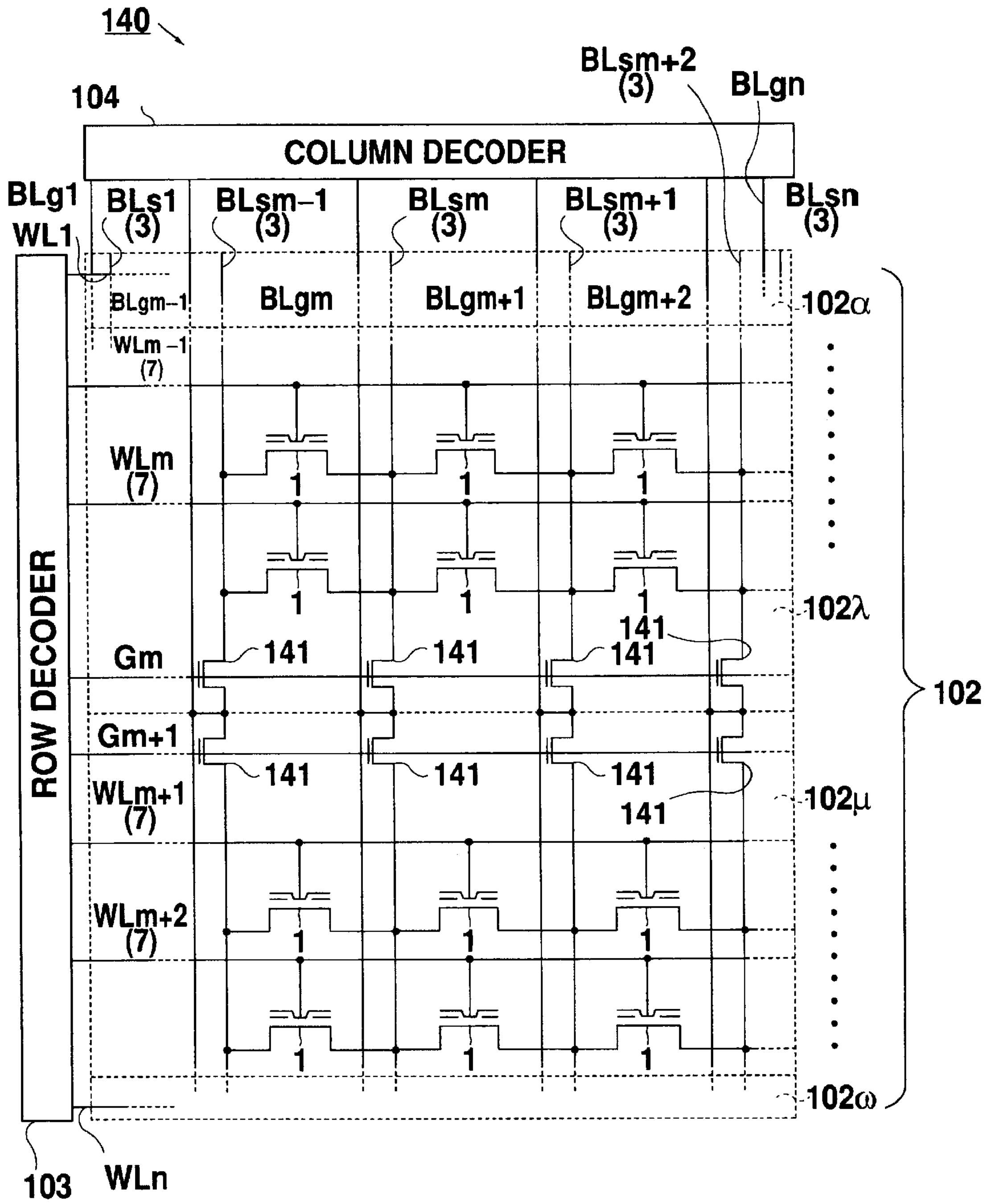
FIG. 15 is a diagram showing an outline of a transistor array.

FIG. 15 shows a configuration of a flash EEPROM 140 related to the present invention.

In the present embodiment, the flash EEPROM 140 differs from the flash EEPROM 101 of the first embodiment in the following points.

{1} The memory cell array 102 corresponds to the word lines WL1–WLn, and divided into a plurality of cell blocks 102α–102 ω laid out in rows. In other words, a cell block 102λ is composed of the memory cells 1 connected to the word lines WLm−1 and WLm. A cell block 102μ is composed of the memory cells 1 connected to the word lines WLm+1 and WLm+2.

{2} In each cell block 102α–102ω, common local short bit lines BLs1–BLsn are formed by the source-drain regions 3 of the memory cell 1 laid out in rows.

{3} Global bit lines BLg1–BLgn are laid out in parallel to the local short bit lines BLs1–BLsn. The global bit lines BLg1–BLgn are formed by an wiring layer composed of a variety of metals including high melting point metals.

{4} In each cell block 102α–102ω, local short bit lines BLs1–BLsn are connected to the global bit lines BLg1–BLgn via MOS transistors 141. Also, in each cell block 102α–102ω, gates of the MOS transistors 141 set at the local short bit lines BLs1–BLsn are connected to common gate lines G1–Gn.

In other words, in the cell block 102λ, the gates of the MOS transistors 141 placed at local short bit lines BLs1–BLsn are connected to a common gate line Gm. In the cell block 102μ, the gates of the MOS transistors 141 placed at local short bit lines BLs1–BLsn are connected to a common gate line Gm+1.

{5} The gate lines G1–Gn are connected to the row decoder 103. When the word line WL1–WLn in any cell block 102α–102ω is selected, the row decoder 103 selects the gate line corresponding to the selected cell block 102α–102ω. As a result, the MOS transistors 141 connected to the selected gate line G1–Gn become an ON state, and each local short bit line BLs1–BLsn is connected to each global bit line BLg1–BLgn.

In other words, if any one of the word lines in the cell block 102λ is selected, the gate line Gm is selected. If any one of the word lines in the cell block 102μ is selected, the gate line Gm+1 is selected.

According to the present embodiment configured as described above, local short bit lines BLs1–BLsn formed by the source-drain regions 3 of each memory cell 1 are placed individually at each cell block 102α–102ω. Therefore, the local short bit lines BLs1–BLsn are shorter than the bit line BL1–BLn of the first embodiment. Each local short bit line BLs1–BLsn is also backed up by the global bit lines BLg1–BLgn formed by a metallic wiring layer.

Therefore, capacities of the global short bit lines BLs1–BLsn are reduced and time necessary for charging/ discharging the local short bit lines BLs1–BLsn is also shortened. As a result, reading speed is increased.

The embodiments of the present invention described above may also be modified as follows, and the same function and effects will also be obtained thereby.

(1) In the first embodiment, the electric charge to be stored in the floating gate electrodes 5 and 6 of the memory cell 1 is set large so that an overwriting state is created.

However, when data is written on the floating gate electrode 6 of the memory cell 1 m(m), if the floating gate electrode 5 has already been in the overwriting state and the channel region 4 under the floating gate electrode 5 is in an complete OFF state, cell current Iw will not flow between the source-drain regions 3*a* and 3*b*.

In this case, at least length of the floating gate electrodes 5 and 6 or the impurity concentration of the substrate 2 can be set so that a constant leak current flows through the channel region 4 under the floating gate electrodes 5 and 6. In this manner, the wanted cell current Iw can be obtained by the leak current even though the floating gate electrodes 5 and 6 are in the overwriting state.

When the memory cell 1 is densified, the length of the floating gate electrodes 5 and 6 will become shorter, causing leak currents to flow easily through the channel region 4. In other words, a method to cause a constant leak current flow through the channel region 4 is more effective than forcing the floating gate electrodes 5 and 6 to be in an overwriting state when the memory cell 1 is densified.

(2) In the third embodiment, the number of bit lines BL1–BLn which each cell block 102*a*–102*z* can be set to more than 4.

Figure 16:
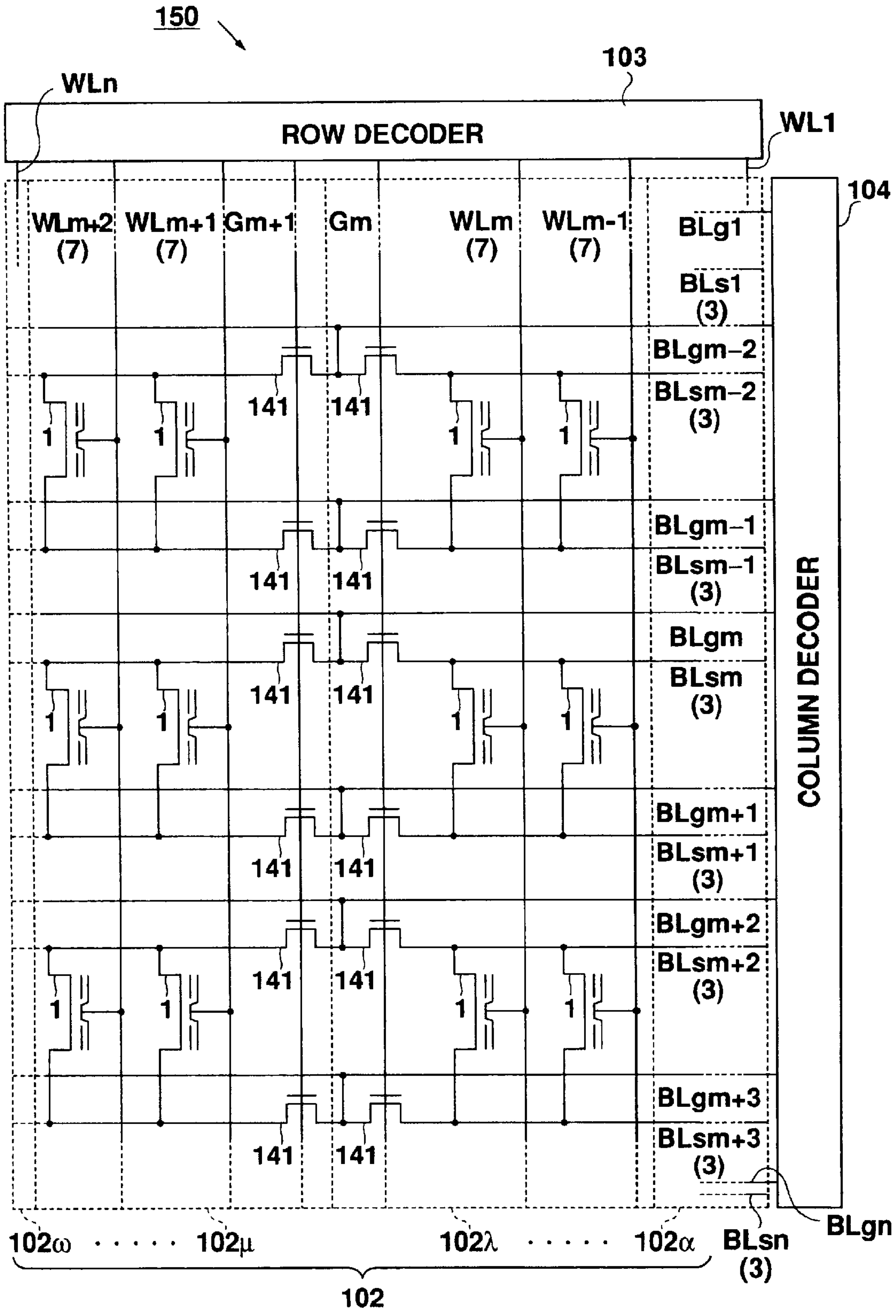
FIG. 16 is a diagram showing an outline of a transistor array.

(3) A combination of the second and third embodiments may be carried out as a fifth embodiment. FIG. 16 shows a configuration of a main part of a flash EEPROM 150 of the fifth embodiment. In this case, reading speed can be further increased by the combined effects of each embodiment.

Figure 17:
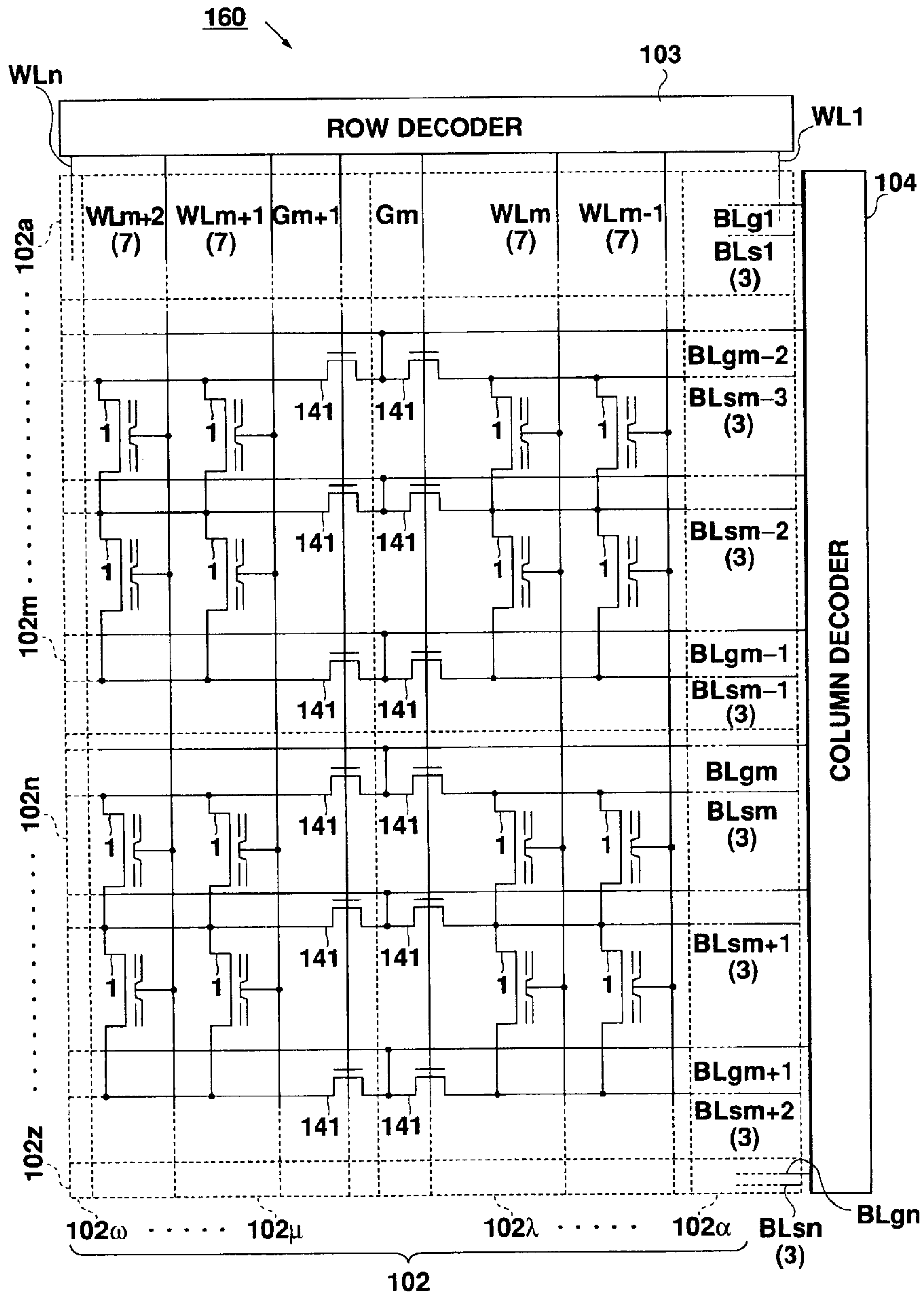
FIG. 17 is a diagram showing an outline of a transistor array.

(4) A combination of the third and fourth embodiments may be carried out as a sixth embodiment. FIG. 17 shows a configuration of a main part of a flash EEPROM 160 of the sixth embodiment. In this case, reading speed can be further increased by the combined effects of each embodiment.

Figure 18:
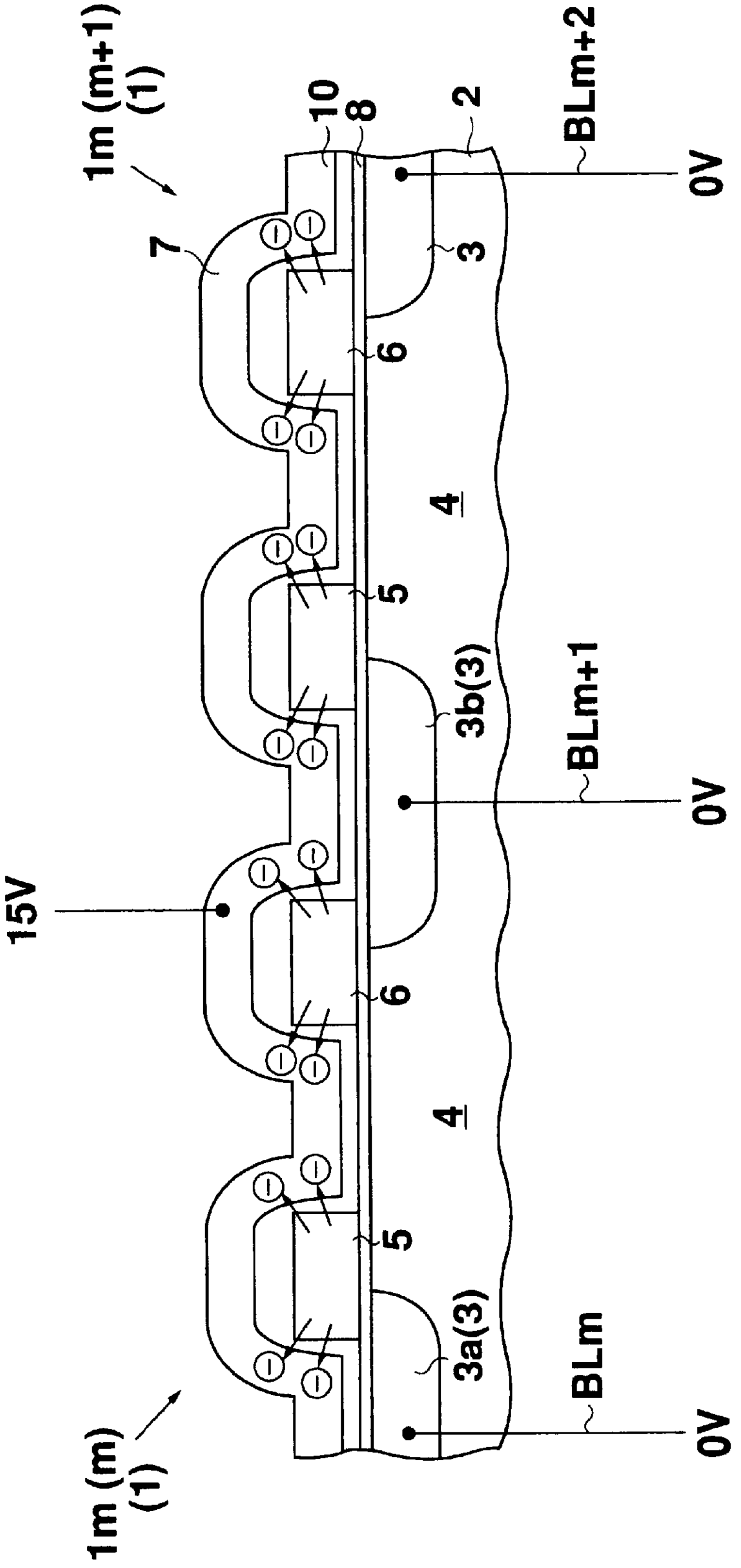
FIG. 18 shows a cross section of a memory cell.
Figure 19:
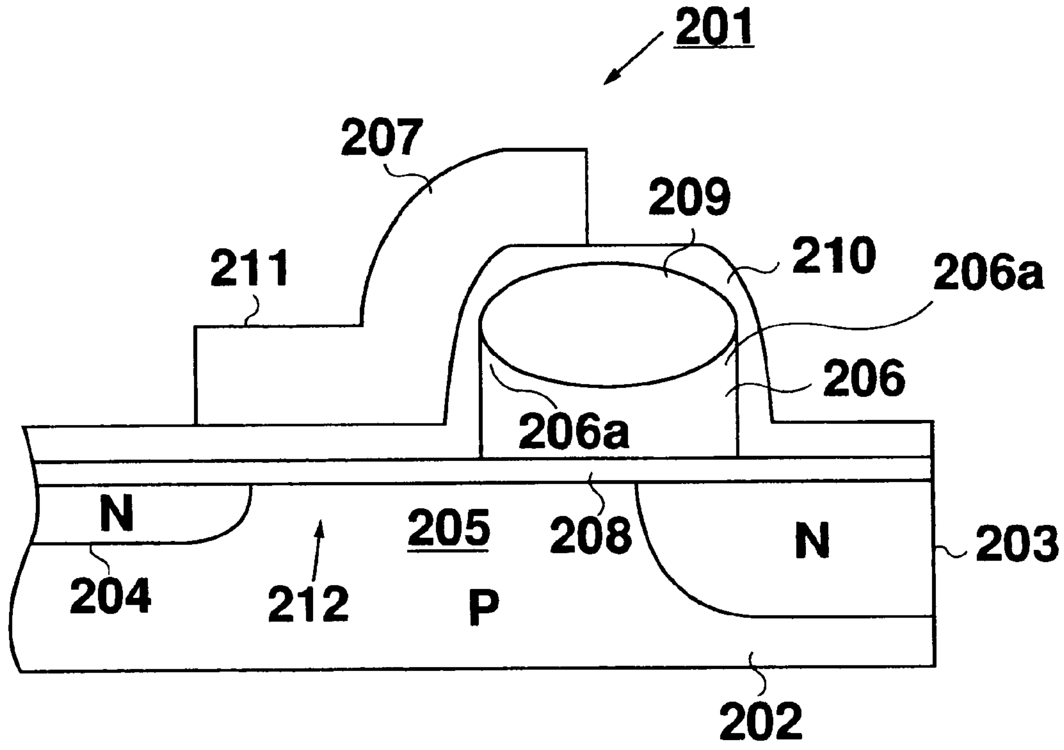
FIG. 19 shows a cross section showing an outline of a transistor in a conventional configuration.
Figure 20A:
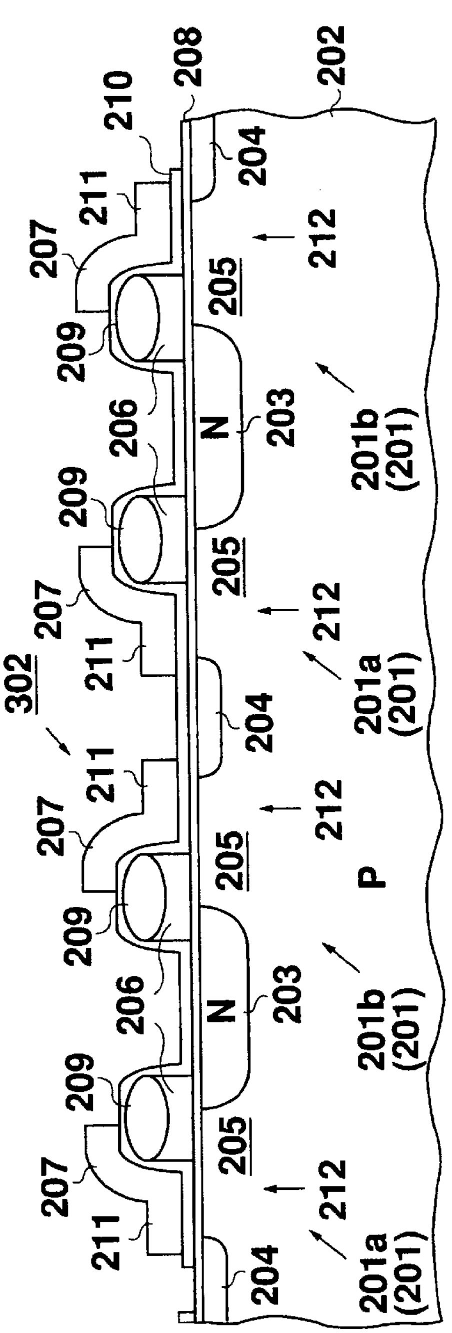
FIG. 20*a* shows a cross section of a conventional transistor cut by the line X—X in FIG. 20*b*.
Figure 20B:
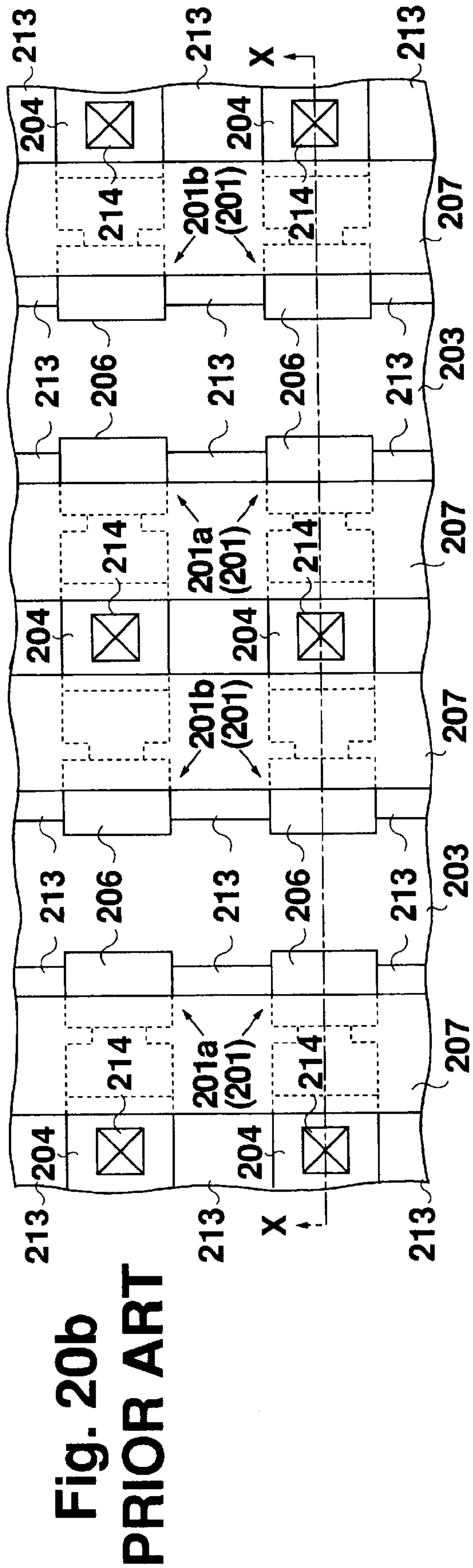
FIG. 20*b* is a top view of the transistor in the conventional configuration.
Figure 21:
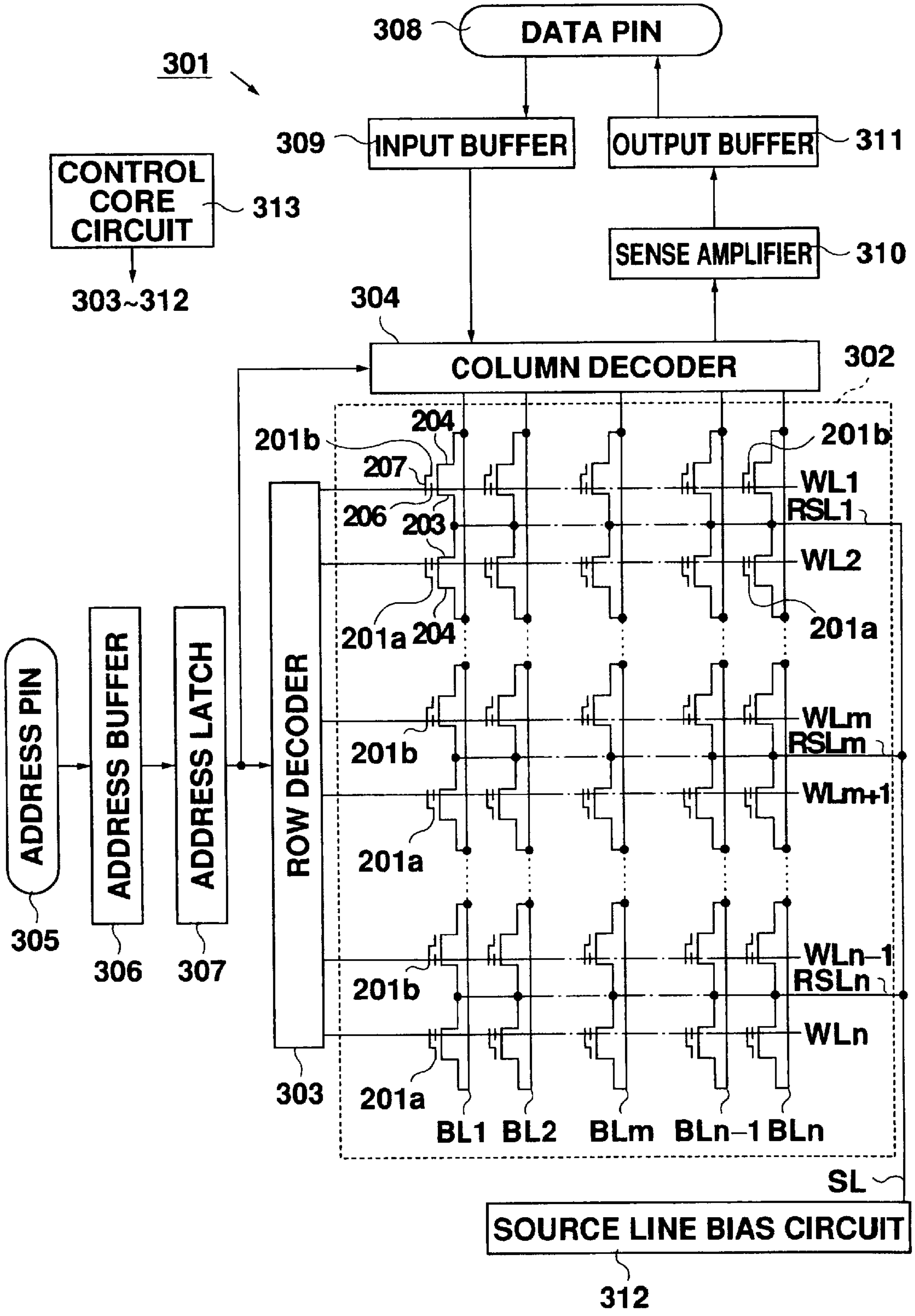
FIG. 21 is a diagram showing an outline of a transistor array in a conventional configuration.

(5) FIG. 18 is a partial cross section of the memory cell array 102 to explain the effects of a seventh embodiment. The seventh embodiment is different from the first embodiment in that the memory cell array 102 of this embodiment does not have protuberances 5*a* and 6*a*.

In the seventh embodiment, writing and reading operations are performed in the same manner as in the first embodiment. In the erasing operation, the electrons in the floating gate electrodes 5 and 6 jump out and move from the side areas or the upper corners of the floating gate electrodes 5 and 6 to the control gate electrode 7 passing through thinner portion of the insulating layer 10.

To produce the memory cell array of the present embodiment, a silicon oxide layer should be formed instead of the silicon nitride layer 22 in FIG. 9*a*. By using the ordinary photo lithography and etching technique, the aforesaid silicon oxide layer and the layer 24 which will both become the floating gate electrodes 5 and 6 are processed. (In this case, the etching mask is the mask with the reversed pattern of the etching mask shown in FIG. 9*a*.) Hereafter, the same process as shown in FIG. 10*d* is performed.

In this embodiment 7, the step shown by FIG. 9*a*, which is necessary in the first embodiment, is not necessary. Therefore, the number of steps can be reduced.

(5) The insulating layers 8 and 10 may be replaced with another insulating layer whose main components are at least one of silicon oxide, silicon nitride oxide, and silicon nitride. To form the aforesaid insulating layer, at least one of the thermal oxidation method, thermal nitration method, thermal nitration oxidation method and CVD method can be used. Alternatively, the insulating layers 8 and 10 can be replaced with the stacked layers of the aforesaid insulating layers with the different components.

(6) The material of the gate electrodes 5–7 may be replaced with a conductive material other than the doped polysilicon (such as amorphous silicon, monocrystalline silicon, a variety of metals including high melting point metals, or metal silicide).

(7) The P type monocrystalline silicon substrate 2 may be replaced with a P type well.

(8) The P type monocrystalline silicon substrate 2 may be replaced with an N type monocrystalline silicon substrate or an N type well, and P type impurity ions, such as boronic or indium ions, can be used as the impurity ions to be injected for forming the source-drain region 3.

(9) The material of the global bit lines BLg1–BLgn may be replaced with a conductive material except for metal (such as doped polysilicon or metal silicide).

(10) The floating gate electrodes 5 and 6 of the memory cell 1 may be made to store more than 3 value data using the multi-state memory technique.

(11) In each embodiment, a writing-with-verify mode may be used in the writing operation.

Technical ideas implied by the embodiments described above beyond the claimed invention will be described with the effects thereof.

(A) The transistor comprising an insulating layer formed by the LOCOS method on the floating gate electrodes.

(B) The method for producing the transistor array which further comprises the step of forming an insulating layer on the first conductive layer using the LOCOS method.

Using a combination of (A) and (B) described above, protuberances on the upper corners of the floating gate electrodes can be formed.

The materials related to the configuration of the present invention are defined as follows.

(a) The semiconductor substrate is meant to include not only the monocrystalline silicon semiconductor substrate, but also wells, monocrystalline silicon layers, polycrystalline silicon layers, amorphous silicon layers, chemical semiconductor substrate, and chemical semiconductor layers.

(b) The conductive layer is meant to include not only the doped polysilicon layer, but also any conductive layer such as amorphous silicon layers, monocrystalline silicon layers, a variety of metal layers including high melting point metals, and metal silicide layers.

(c) The capacity between the floating gate electrode and the substrate means to include the capacity between the floating gate electrode and the source-drain region formed on the substrate, or the capacity between the floating gate electrode and the channel region formed on the substrate, or the both.

(d) To set the electric charge to be stored in one of the floating gate electrodes so that a necessary cell current flows while a data is written on the other floating gate electrode means to include the case where the electric charge is zero.

According to the present invention, it is possible to provide transistors with less fluctuation in writing characteristics, with a denser structure, with fewer over erasing problems, and with a simpler structure.

According to the present invention, it is possible to provide transistor arrays composed of transistors with less fluctuation in writing characteristic, with a denser structure, with no over erasing problems, and with a simpler structure.

According to the present invention, it is possible to provide a method for producing transistor arrays composed of transistors with less fluctuation in writing characteristic, with a denser structure, with fewer over erasing problems, and with a simpler structure.

According to the present invention, it is possible to provide nonvolatile semiconductor memories using memory cells composed of transistors with less fluctuation in writing characteristic, with a denser structure, with fewer over erasing problems, and with a simpler structure.

What is claimed is:

1. A transistor comprising floating gate electrodes in which an electric charge is injected, comprising: two source-drain regions formed on a semiconductor substrate, an insulating layer on the semiconductor substrate, two floating gate electrodes formed closely separated from each other on the insulating layer and placed between the two source-drain regions, and a common control gate electrode placed on an upper layer of the two floating gate electrodes, wherein a capacity between each of the floating gate electrodes and the semiconductor substrate is set larger than a capacity between each of the floating gate electrodes and the control gate electrode.

2. A transistor comprising floating gate electrodes in which an electric charge is injected, comprising a semiconductor substrate comprising a first and a second source-drain regions, a channel region placed between the first and the second source-drain regions, a gate insulating layer on the semiconductor substrate, a first floating gate electrode placed near the first source-drain region and formed on the gate insulating layer, a second floating gate electrode placed closely separated from the first floating gate electrode and near the second source-drain region and formed on the gate insulating layer, an insulating layer on the first and the second floating gate electrode, and a control gate electrode on the insulating layer, wherein a capacity between each of the floating gate electrodes and the semiconductor substrate is set larger than a capacity between each of the floating gate electrodes and the control gate electrode.

3. The transistor according to claim 2, wherein the configuration of the second source-drain region is symmetric to the first source-drain region, and the size and shape of the second floating gate electrode are exactly equal to the size and shape of the first floating gate electrode.

4. The transistor according to claim 2, further comprising protuberances in upper portions of the first and the second floating gate electrodes.

5. The transistor according to claim 2, further comprising a selecting gate electrode extended from the control gate electrode and placed on the gate insulating layer between the first and second floating gate electrodes.

6. The transistor according to claim 2, wherein, when data is written in said second floating gate electrode by injection of electric charge, a predetermined electric charge amount to be stored in the first floating gate electrode is set so that a cell current necessary for writing data flows in the second floating gate electrode.

7. The transistor according to claim 2, wherein, when data is written in said second floating gate electrode by injection of electric charge, a cell current flows from the second source-drain region to the first source-drain region, a high potential field is created between the channel region and the second floating gate electrode due to coupling via a capacity between the second source-drain region and the second floating gate electrode, electrons in the channel region are accelerated to become hot electrons, electric charge is stored in the second floating gate electrode by the hot electrons injected in the second floating gate electrode, and data corresponding to the electric charge is written and stored therein.

8. The transistor according to claim 7, wherein the electric charge stored in the second floating gate electrode is adjusted by adjustments of said cell current and injection duration of hot electrons to the second floating gate electrode, and the electric charge stored in the second floating gate electrode is set to a small value so that no overwriting state will occur.

9. The transistor according to claim 7, wherein the electric charge stored in the second floating gate electrode is adjusted by adjustment of said cell current and injection duration of hot electrons to the second floating gate electrode, and the electric charge stored in the second floating gate electrode is set to a large value so that the overwriting state will occur, and at least one of the first floating gate electrode's gate length or an impurity concentration of the substrate is set so that a certain value leak current corresponding to the cell current will flow in the channel region under the first floating gate electrode.

10. The transistor according to claim 7, wherein, when data is written in the second floating gate electrode by injection of electrical charge therein, a predetermined electric charge amount to be stored in first floating gate electrode is set so that a cell current necessary for writing data in the second floating gate electrode flows.

11. The transistor according to claim 2, wherein, when data is written in said second floating gate electrode by injection of electric charge, the first source-drain region is grounded via a constant current source, a second voltage is applied to the second source-drain region, a third voltage lower than the second voltage is applied to the control gate electrode, a cell current flows from the second source-drain region to the first source-drain region, a potential at the second floating gate electrode is raised by coupling via a capacity between the second source-drain region and the second floating gate electrode, a high potential field is created between the channel region and the second floating gate electrode, electrons in the channel region are accelerated to become hot electrons, electric charge is stored in the second floating gate electrode by injection of the hot electrons to the second floating gate electrode, data corresponding to the electric charge is written and stored therein, a potential of the first floating gate electrode is raised by coupling via a capacity between the first source-drain region and the first floating gate electrode, hot electrons are substantially none injected to the first floating gate electrode however due to a low potential of the first floating gate electrode.

12. The transistor according to claim 8, wherein, when data is written in the second floating gate electrode by injection of electrical charge therein, a predetermined electric charge amount to be stored in first floating gate electrode is set so that a cell current necessary for writing data in the second floating gate electrode flows.

13. The transistor according to claim 2, wherein the channel region superposed by the first floating gate electrode enters an ON state due to coupling via the capacity between the first source-drain region and the first floating gate electrode regardless of a state of the electric charge stored in the first floating gate, and the data stored in the second floating gate electrode is read based on the cell current flowing from the first source-drain region to the second source-drain region.

14. The transistor according to claim 2, wherein the channel region superposed by the first floating gate electrode maintains an ON state due to coupling via the capacity between the first source-drain region and the first floating gate electrode regardless of a state of the electric charge stored in the first floating gate, the channel region superposed by the second floating gate electrode in an erasing mode is set to an ON state, the channel region superposed by the second floating gate electrode in a writing mode becomes close to an OFF state, and data stored in the second floating gate electrode is read by judgment of the writing state or the erasing state of the second floating gaze electrode based on the value of the cell current flowing between the first source-drain region and the second source-drain region.

15. The transistor according to claim 2, wherein a third voltage is applied to the first source-drain region, a fourth voltage lower than the third voltage is applied to the second source-drain region, a fifth voltage is applied to the control gate electrode, a potential of the first floating gate electrode is raised by coupling via the capacity between the first source-drain region and the first floating gate electrode, the channel region superposed by the first floating gate electrode is set to an ON state regardless of a state of electric charge stored in the first floating gate electrode, the channel region superposed by the second floating gate electrode in an erasing mode in which no electric charge is stored is set to an ON state, the channel region superposed by the second floating gate electrode in a writing mode in which electric charge is stored is set close to an OFF state, and data stored in the second floating gate electrode is read by judgment of the writing state or the erasing state of the second floating gate electrode based on the value of the cell current flowing between the first source-drain region and the second source-drain region.

16. The transistor according to claim 2, wherein a sixth voltage is applied to the first and second source-drain regions, a seventh voltage higher than the sixth voltage is applied to the control gate electrode, potentials of the first and the second floating gate electrodes are substantially maintained at the sixth voltage because of the first and the second floating gate electrodes being strongly coupled with the first and the second source-drain regions, a potential difference between the control gate electrode and the first and the second floating gate electrodes is made large, a high potential electric field is created between the control gate and the first and the second floating gate electrodes, letting a Fowler-Nordheim tunnel current flow therebetween, electrons in the first and the second floating gate electrodes are thus pulled toward the control gate electrode, and data stored in the first and second floating gate electrodes is erased.

17. The transistor according to claim 2, wherein a sixth voltage is applied to the first and second source-drain regions, a seventh voltage higher than the sixth voltage is applied to the control gate electrode, potentials of the first and the second floating gate electrodes are substantially maintained at the sixth voltage because of the first and the second floating gate electrodes being strongly coupled with the first and the second source-drain regions, a potential difference between the control gate electrode and the first and the second floating gate electrodes is made large, a high potential electric field is created between the control gate and the first and the second floating gate electrodes, letting a Fowler-Nordheim tunnel current flow therebetween, electrons in the first and second floating gate electrodes are thus jumped to the control gate electrode from thereof, and data stored in the first and second floating gate electrodes is erased.

18. A semiconductor memory wherein data is written by injecting electric charge into floating gate electrodes thereof, comprising:

two source-drain regions formed on a semiconductor substrate;

an insulating layer on the semiconductor substrate;

two floating gate electrodes placed closely separated from each other on the insulating layer and positioned between the two source-drain regions; and a common control gate electrode placed in an upper layer of the two floating gate electrodes, wherein data is erased by pulling the electric charge injected in the floating gate electrodes toward the control gate electrode, and wherein a capacity between each of the floating gate electrodes and the semiconductor substrate is set larger than a capacity between each of the floating gate electrodes and the control gate electrodes.

* * * * *